United States Patent
Yoon et al.

(10) Patent No.: US 9,041,303 B2
(45) Date of Patent: May 26, 2015

(54) AC LED LIGHTING APPARATUS

(71) Applicant: POSCO LED COMPANY LTD., Seongnam-si (KR)

(72) Inventors: Seong Bok Yoon, Seongnam-si (KR); Hwi Seok Yang, Seongnam-si (KR); Chul Ju Kim, Seongnam-si (KR)

(73) Assignee: Posco LED Company Ltd., Seongnam-si (KR)

( * ) Notice: Subject to any disclaimer, the term of this patent is extended or adjusted under 35 U.S.C. 154(b) by 85 days.

(21) Appl. No.: 13/907,162

(22) Filed: May 31, 2013

(65) Prior Publication Data

US 2014/0292213 A1    Oct. 2, 2014

(30) Foreign Application Priority Data

Mar. 29, 2013  (KR) .................. 10-2013-0034330
Mar. 29, 2013  (KR) .................. 10-2013-0034331

(51) Int. Cl.
  *H05B 37/00*   (2006.01)
  *H05B 39/00*   (2006.01)
  *H05B 41/00*   (2006.01)
  *F21S 4/00*    (2006.01)
  *H05B 33/08*   (2006.01)

(52) U.S. Cl.
  CPC ........ *H05B 33/0824* (2013.01); *H05B 33/0821* (2013.01)

(58) Field of Classification Search
  CPC . F21S 4/001; H05B 33/0815; H05B 33/0821; H05B 33/0803; H05B 37/029; H05B 33/0827; F21Y 2101/02
  USPC .................... 315/192, 191, 185, 36
  See application file for complete search history.

(56) References Cited

U.S. PATENT DOCUMENTS

| | | | |
|---|---|---|---|
| 7,439,944 B2 * | 10/2008 | Huynh et al. ............ | 345/82 |
| 8,686,649 B2 * | 4/2014 | Shin et al. ............ | 315/185 R |
| 8,686,651 B2 * | 4/2014 | Lynch et al. ............ | 315/192 |
| 8,847,501 B1 * | 9/2014 | Chu et al. ............ | 315/193 |
| 2011/0227489 A1 * | 9/2011 | Huynh ............ | 315/185 R |
| 2012/0056559 A1 * | 3/2012 | Fu et al. ............ | 315/297 |
| 2012/0057344 A1 * | 3/2012 | Wang ............ | 362/235 |
| 2013/0170183 A1 * | 7/2013 | Hsieh et al. ............ | 362/95 |
| 2014/0042918 A1 * | 2/2014 | Lee ............ | 315/185 R |

* cited by examiner

*Primary Examiner* — Dylan White

(74) *Attorney, Agent, or Firm* — H.C. Park & Associates, PLC

(57) ABSTRACT

Embodiments of the invention provide AC LED lighting apparatuses. The AC LED lighting apparatuses may increase luminous flux and provide optimal efficiency through novel arrangement of a plurality of light emitting blocks on a circuit board and a plurality of LEDs and drive ICs included in each of the light emitting blocks to be sequentially driven, and/or through efficient series-parallel connection between a limited number of LEDs.

7 Claims, 17 Drawing Sheets

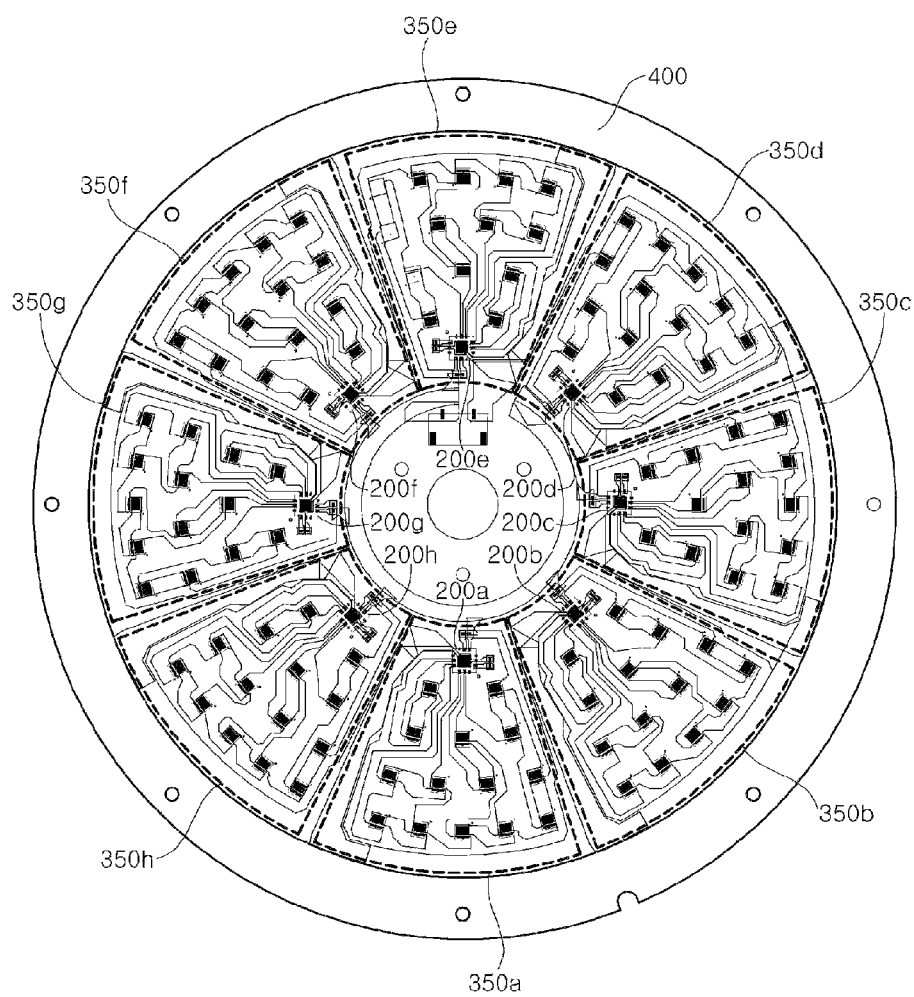

AC LED LIGHTING APPARATUS

CROSS-REFERENCE TO RELATED APPLICATIONS

This application claims priority from and the benefit of Korean Patent Application No. 10-2013-0034330, filed on Mar. 29, 2013, and Korean Patent Application No. 10-2013-0034331, filed on Mar. 29, 2013, which are hereby incorporated by reference for all purposes as if fully set forth herein.

BACKGROUND OF THE INVENTION

1. Field of the Invention

Embodiments of the invention relate to light emitting diode (LED) lighting apparatuses driven by AC power, and more particularly, to AC LED lighting apparatuses that may increase luminous flux with optimal efficiency through optimal arrangement of a plurality of light emitting blocks on a circuit board and a plurality of LEDs and drive ICs included in each is of the light emitting blocks to be sequentially driven, and/or through efficient series-parallel connection between a limited number of LEDs.

2. Discussion of the Background

Generally, a light emitting diode package includes a light emitting diode chip, a lead frame, and a package body. The lead frame includes a plurality of terminals having different polarities. The package body serves to support the lead frame. The terminals extend from the interior of the package body to the outside of the package body. The light emitting diode chip is electrically connected to the terminals inside the package body. The package body is generally formed of a plastic resin or ceramic material. The package body of the plastic material may have a cavity, which receives the light emitting diode chip while optically exposing the light emitting diode chip therethrough, or may be at least partially transparent to allow light generated in the light emitting diode chip to be emitted to the outside therethrough.

A light emitting diode (LED) is a semiconductor device formed of semiconductor materials, such as gallium (Ga), phosphorous (P), arsenic (As), indium (In), nitrogen (N), aluminum (Al), and the like. LEDs have characteristics of a diode and emit red, green or blue light upon application of electric current thereto. LEDs are broadly used in the art, due to various advantages of longer lifespan, faster response rate (time between application of current and light emission) and lower power consumption than electric bulbs.

Generally, a light emitting diode can be driven only by DC power due to inherent characteristics of diode. As a result, a light emitting device employing such a conventional light emitting diode is limited in applicability and requires a separate circuit such as an SMPS when used in domestic settings employing AC power, thereby complicated circuit design of a lighting apparatus while increasing manufacturing costs.

To solve such problems, studies have focused on development of a light emitting device capable of being driven by AC power by connecting a plurality of light emitting cells to each other in series-parallel.

FIG. 1 is a block diagram of an AC LED lighting apparatus in the related art, and FIG. 2 is a waveform diagram of rectified voltage and LED driving current of the AC LED lighting apparatus of FIG. 1.

As shown in FIG. 1, the AC LED lighting apparatus in the related art includes a rectifier 10 which receives AC voltage from an AC power source $V_{AC}$ and outputs rectified voltage $V_{rec}$ through full-wave rectification, first to fourth light emitting groups 20, 22, 24, 26 which are sequentially driven by the rectified voltage $V_{rec}$, a drive controller 40 which controls sequential driving of the first to fourth light emitting groups 20, 22, 24, 26 according to a voltage level of the rectified voltage $V_{rec}$, and first to fourth light emitting group drivers SW1, SW2, SW3, SW4, which have a switching function and a constant current controlling function.

Referring to FIG. 2, in operation of the AC LED lighting apparatus, the drive controller 40 determines a voltage level of rectified voltage $V_{rec}$ applied by the rectifier 10, and sequentially drives the first to fourth light emitting groups 20, 22, 24, 26 according to the determined voltage level of the rectified voltage $V_{rec}$.

Thus, in zones in which the voltage level of the rectified voltage $V_{rec}$ is greater than or equal to a first threshold voltage $V_{TH1}$ and is less than a second threshold voltage $V_{TH2}$ (t1~t2 and t7·t8 in a single cycle of the rectified voltage), the drive controller 40 maintains a first switch SW1 in an on state and maintains a second switch SW2, a third switch SW3 and a fourth switch SW4 in an off state to allow only the first light emitting group 20 to be driven.

In addition, in zones in which the voltage level of the rectified voltage $V_{rec}$ is is greater than or equal to the second threshold voltage $V_{TH2}$ and is less than a third threshold voltage $V_{TH3}$ (t2~t3 and t6~t7 in a single cycle of the rectified voltage), the drive controller 40 maintains the second switch SW2 in an on state and maintains the first switch SW1, the third switch SW3 and the fourth switch SW4 in an off state to allow only the first light emitting group 20 and the second light emitting group 22 to be driven.

Further, in zones in which the voltage level of the rectified voltage $V_{rec}$ is greater than or equal to the third threshold voltage $V_{TH3}$ and is less than a fourth threshold voltage $V_{TH4}$ (t3~t4 and t5~t6 in a single cycle of the rectified voltage), the drive controller 40 maintains the third switch SW3 in an on state and maintains the first switch SW1, the second switch SW2 and the fourth switch SW4 in an off state to allow the first light emitting group 20, the second light emitting group and the third light emitting group 24 to be driven.

Further, in zones in which the voltage level of the rectified voltage $V_{rec}$ is greater than or equal to the fourth threshold voltage $V_{TH4}$ (t4~t5 in a single cycle of the rectified voltage), the drive controller 40 maintains the fourth switch SW4 in an on state and maintains the first switch SW1, the second switch SW2 and the third switch SW3 in an off state to allow all of the first to fourth light emitting groups 20, 22, 24, 26 to be driven.

In such a conventional AC LED lighting apparatus as shown in FIG. 1, although luminous flux can be regulated by adjusting the number of LEDs constituting each of the light emitting groups in the LED lighting apparatus, there can be a problem of inefficiency in adjustment of the number of LEDs constituting each of the light emitting groups. In other words, although the number of LEDs in each of the light emitting groups can be increased to increase luminous flux of the LED lighting apparatus, the number of LEDs to be added to the LED lighting apparatus may be limited due to physical limitations (such as a maximum value of the is rectified voltage $V_{rec}$, a forward voltage level of the light emitting groups, the number of LEDs to be included in the LED lighting apparatus, manufacturing costs, and the like). However, conventional techniques do not provide arrangement of LEDs (series-parallel connection between LEDs) capable of achieving effective improvement of luminous flux of the LED lighting apparatus using a limited number of LEDs.

On the other hand, the conventional AC LED lighting apparatus as described above allows only a limited number of LEDs to be driven according to the standard of an AC power source connected thereto. Accordingly, in the case of illuminating a wider area, the aforementioned conventional AC LED lighting apparatus employing a sequential driving manner cannot be used. Thus, in manufacture of a large LED lighting apparatus, a separate power source circuit such as an SMPS is used. Use of the separate power source circuit such as the SMPS in manufacture of such a large LED lighting apparatus requires complex circuitry and increases manufacturing costs. Thus, there is an increasing need for a large LED lighting apparatus using a sequential drive type AC direct LED drive IC. However, when the large LED lighting apparatus employs a single sequential drive type AC direct LED drive IC, it is difficult for the large LED lighting apparatus to achieve uniform illumination due to individual driving of the plural light emitting blocks including a plurality of light emitting groups sequentially driven according to a voltage level of rectified voltage applied thereto. Therefore, there is a need for improved arrangement of LEDs on a circuit board in order to solve such a problem. However, in manufacture of large LED lighting apparatuses using a sequential drive type AC direct LED drive IC to provide uniform illumination, techniques in the related art do not provide a clear solution for improved and structural LED arrangement.

SUMMARY OF THE INVENTION

The present invention has been conceived to solve such problems in the related art.

One exemplary embodiment of the invention provides an AC LED lighting apparatus that includes a plurality of light emitting blocks, each including a plurality of light emitting groups sequentially driven in the corresponding light emitting block, wherein the light emitting blocks are disposed in an optimal arrangement to provide maximum luminous efficacy and uniform illumination to the LED lighting apparatus.

Another exemplary embodiment of the invention provides an AC LED lighting apparatus that includes a plurality of light emitting blocks, each including a plurality of light emitting groups sequentially driven in the corresponding light emitting block, wherein the plurality of light emitting groups is disposed in an optimal arrangement to provide maximum luminous efficacy and uniform illumination to the LED lighting apparatus.

A further exemplary embodiment of the invention provides an AC LED lighting apparatus that includes a plurality of sequentially driven light emitting groups, wherein a limited number of LEDs is efficiently connected in series-parallel to increase luminous flux of the LED lighting apparatus with optimal efficiency.

In accordance with one aspect, the present invention provides an AC LED lighting apparatus, which includes a circuit board having a circuit pattern formed thereon to electrically connect LEDs; and first to n-th light emitting blocks (n being a positive integer ≥2) disposed on the circuit board and driven by AC voltage, each of the light emitting blocks including first to m-th light emitting groups (m being a positive integer ≥2) sequentially driven according to a voltage level of the AC voltage, and LED drive ICs disposed on the circuit board and controlling sequential driving of the first to m-th light emitting groups according to the voltage level of the AC voltage. Here, the first to n-th light emitting blocks are radially disposed on a concentric circle about a center of the circuit board, and first to n-th LED drive ICs respectively included in the first to n-th light emitting blocks are disposed adjacent to the center of the circuit board.

In one embodiment, the LED lighting apparatus may further include a power supply unit which supplies AC voltage applied from an external AC power source to the first to n-th LED drive ICs. The power supply unit may be disposed around the center of the circuit board.

In one embodiment, the first to m-th light emitting groups in each of the light emitting blocks may be arranged to be sequentially turned on in a direction from the center of the circuit board toward a periphery thereof as the voltage level of the rectified voltage increases, and to be sequentially turned off in a direction from the periphery of the circuit board toward the center thereof as the voltage level of the rectified voltage decreases.

In one embodiment, the first to m-th light emitting groups in each of the light emitting blocks may be arranged to be sequentially turned on in a direction from the periphery of the circuit board toward the center thereof as the voltage level of the rectified voltage increases, and to be sequentially turned off in a direction from the center of the circuit board toward the periphery thereof as the voltage level of the rectified voltage decreases.

In one embodiment, the first to m-th light emitting groups in each of the light emitting blocks may be arranged to be sequentially turned on in the clockwise direction as the voltage level of the rectified voltage increases, and to be sequentially turned off in the counterclockwise direction as the voltage level of the rectified voltage decreases.

In one embodiment, the first to m-th light emitting groups in each of the light emitting blocks may be arranged to be sequentially turned on in the counterclockwise direction is as the voltage level of the rectified voltage increases, and to be sequentially turned off in the clockwise direction as the voltage level of the rectified voltage decreases.

In one embodiment, the first to m-th light emitting groups in each of the light emitting blocks may be arranged to be sequentially turned on in a zigzag manner in a direction from the center of the circuit board toward a periphery thereof as the voltage level of the rectified voltage increases, and to be sequentially turned off in a zigzag manner in a direction from the periphery of the circuit board toward the center thereof as the voltage level of the rectified voltage decreases.

In one embodiment, the first to m-th light emitting groups may be arranged in each of the light emitting blocks to be sequentially turned on in a zigzag manner in a direction from the periphery of the circuit board toward the center thereof as the voltage level of the rectified voltage increases, and to be sequentially turned off in a zigzag manner in a direction from the center of the circuit board toward the periphery thereof as the voltage level of the rectified voltage decreases.

In one embodiment, the first to m-th light emitting groups may be arranged in each of the light emitting blocks to be sequentially turned on in a zigzag manner in the clockwise direction as the voltage level of the rectified voltage increases, and to be sequentially turned off in a zigzag manner in the counterclockwise direction as the voltage level of the rectified voltage decreases.

In one embodiment, the first to m-th light emitting groups may be arranged in each of the light emitting blocks to be sequentially turned on in a zigzag manner in the counterclockwise direction as the voltage level of the rectified voltage increases, and to be sequentially turned off in a zigzag manner in the clockwise direction as the voltage level of the is rectified voltage decreases.

In one embodiment, each of the first to m-th light emitting groups may include a first string including i LEDs (i being a positive integer ≥1) connected in series, and the first light emitting group (when m is 2 or more) or at least one light emitting group selected from among the first to m−1-th light emitting groups (when m is 3 or more) may further include a second string connected in parallel to the first string and including i LEDs connected in series.

In one embodiment, the first to m-th light emitting groups and the LED drive ICs may be disposed on the same plane of the circuit board.

In one embodiment, the first to m-th light emitting groups and the LED drive ICs may be disposed on different planes of the circuit board.

In accordance with another aspect, the present invention provides an AC LED lighting apparatus, which includes a rectifier generating a rectified voltage through full-wave rectification of AC voltage applied to the apparatus and outputting the rectified voltage; an LED drive controller controlling sequential driving of first to m-th light emitting groups (m being a positive integer ≥2) according to a voltage level of the rectified voltage; and the first to m-th light emitting groups sequentially driven under control of the LED drive controller, wherein each of the first to m-th light emitting groups includes a first string connecting i (i being an integer ≥1) LEDs to each other in series, and the first light emitting group (when m is 2 or more) or at least one light emitting group from among the first to m−1-th light emitting groups (when m is 3 or more) may further include a second sting (connecting i LEDs to each other in series) connected in parallel to the first string.

In one embodiment, each of the first to m-th light emitting groups may include first to j-th strings (j being a positive integer ≥2) connected in parallel to each other, the first is light emitting group (when m is 2 or more) or at least one light emitting group selected from among the first to m−1-th light emitting groups (when m is 3 or more) may further include a j+1-th string connected in parallel to the j-th string, and each of the first to j+1-th strings includes i LEDs connected in series.

In one embodiment, the first light emitting group may further include one more string than the m-th light emitting group.

In one embodiment, m is 3 or more, and each of the first and second light emitting groups may further include one more string than the m-th light emitting group.

In one embodiment, the first light emitting group and the m−1-th light emitting group may further include one more string than the m-th light emitting group.

As described above, according to embodiments of the invention, the sequential drive type LED lighting apparatus may have maximum luminous efficacy and uniform illumination by disposing a plurality of lighting blocks in an optimal arrangement.

In addition, according to the invention, a plurality of light emitting groups is disposed in optimal arrangement to be sequentially driven in each of light emitting blocks, whereby the sequential drive type LED lighting apparatus can have maximum luminous efficacy and uniform illumination.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further is understanding of the invention and are incorporated in and constitute a part of this specification, illustrate embodiments of the invention, and together with the description serve to explain the principles of the invention.

FIG. 5 is a layout diagram of a circuit board and LEDs disposed on the circuit is board in an AC LED lighting apparatus according to one exemplary embodiment of the present invention.

DETAILED DESCRIPTION OF THE ILLUSTRATED EMBODIMENTS

Figure 1:
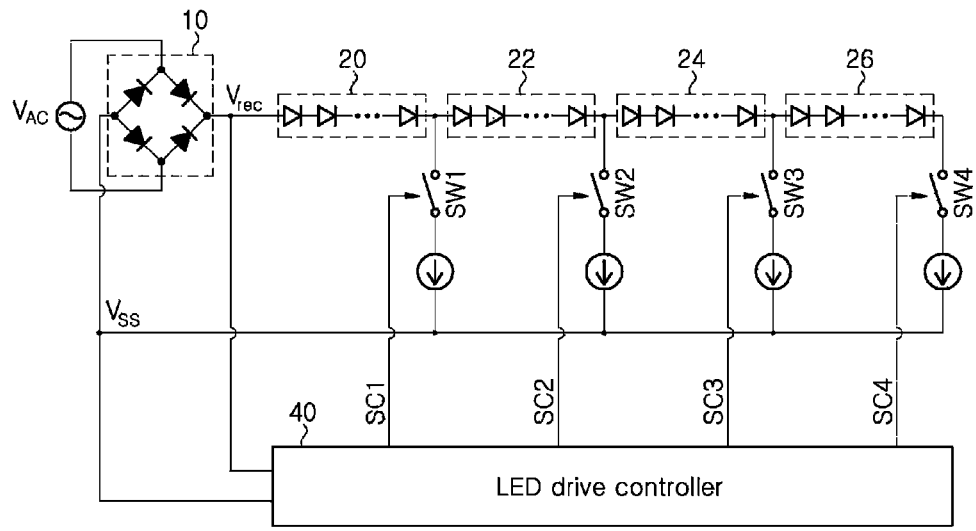
FIG. 1 is a block diagram of an AC LED lighting apparatus in the related art.

The invention is described more fully hereinafter with reference to the accompanying drawings, in which exemplary embodiments of the invention are illustrated. These embodiments will be described such that the invention can be easily realized by a person having ordinary knowledge in the art. Here, although various embodiments are disclosed herein, it should be understood that these embodiments are not intended to be exclusive. For example, individual structures, elements or features of a particular embodiment are not limited to that particular embodiment and can be applied to other embodiments without departing from the spirit and scope of the invention. In addition, it should be understood that locations or arrangement of individual components in each of the embodiments may be changed without departing from the spirit and scope of the present invention. Therefore, the following embodiments are not to be construed as limiting the invention, and the present invention should be limited only by the claims and equivalents thereof. Like components will be denoted by like reference numerals, and lengths, areas, thicknesses and shapes of the components are not drawn to scale throughout the accompanying drawings.

Now, exemplary embodiments of the invention will be described in detail with reference to the accompanying drawings so as to be easily realized by a person having ordinary knowledge in the art.

Exemplary Embodiments

As used herein, the term 'light emitting groups' refers to a set of LEDs (LED packages) connected in series/in parallel/in series-parallel to emit light within the lighting apparatus and operated as an individual unit (that is, turn on/off together) under control of a is controller.

In addition, the term 'threshold voltage ($V_{TH}$)' means a voltage level capable of driving at least one light emitting group. Thus, the term 'first threshold voltage ($V_{TH1}$)' means a voltage level capable of driving a first light emitting group, and the term 'second threshold voltage ($V_{TH2}$)' means a voltage level capable of driving the first and second light emitting groups. When the threshold voltage of the first light emitting group is the same as the threshold voltage of second light emitting group, the second threshold voltage ($V_{TH2}$) is $2V_{TH1}$. Thus, as used herein, the term 'n-th threshold voltage ($V_{THn}$)' means a voltage level capable of simultaneously driving the first to n-th light emitting groups.

Further, the term 'sequential drive type' means sequentially turning on/off the plurality of light emitting groups according to a voltage level of rectified voltage generated through full-wave rectification of AC voltage.

Further, the term 'LED drive IC' means an integrated circuit configured to control sequential turn-on and turn-off of the plurality of light emitting groups according to a voltage level of rectified voltage generated through full-wave rectification of AC voltage or according to a voltage level of rectified voltage applied thereto.

Further, the term 'light emitting block' means a block constituted by a plurality of light emitting groups controlled to be sequentially driven and LED drive ICs for controlling sequential driving of the plurality of light emitting groups. Thus, when each of a plurality of light emitting blocks included in each of LED lighting apparatuses includes a plurality of light emitting groups (for example, first to fourth light emitting groups) having the same threshold voltage, the light emitting groups included in each of the light emitting blocks are simultaneously turned on or off. For example, first light emitting groups respectively included in the first to n-th is light emitting blocks (n being a positive integer ≥2) are simultaneously turned on or off. Likewise, second light emitting groups respectively included in the first to n-th light emitting blocks are also turned on or off simultaneously. Therefore, each of first to m-th light emitting groups (m being a positive integer ≥2) included in the first to n-th light emitting blocks are turned on or off simultaneously with other first to m-th light emitting groups included in the first to n-th light emitting blocks.

Figure 3A:
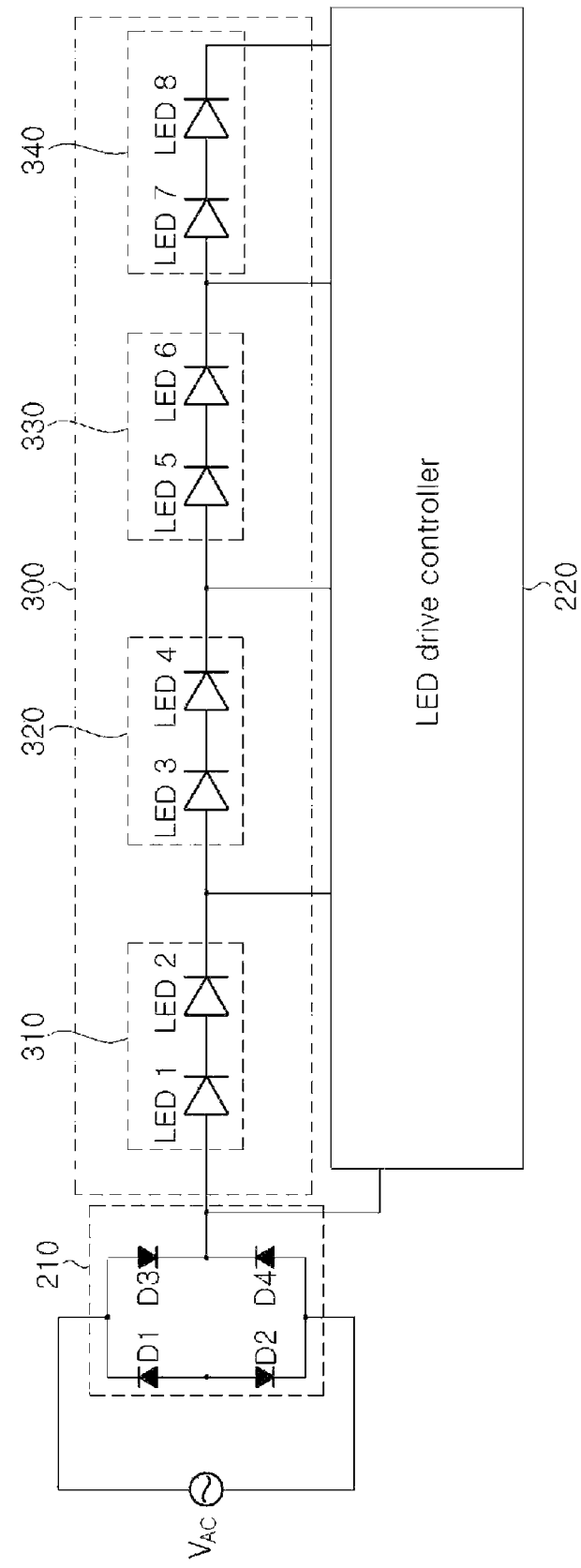
FIG. 3A is a block diagram of an AC LED lighting apparatus in the related art for comparison with an AC LED lighting apparatus according to one exemplary embodiment of the present invention.

FIG. 3A is a block diagram of an AC LED lighting apparatus in the related art for comparison with an AC LED lighting apparatus according to one exemplary embodiment of the invention Like the AC LED lighting apparatus of FIG. 1, as shown in FIG. 3A, a conventional AC LED lighting apparatus may include a rectifier 210 generating a rectified voltage through full-wave rectification of AC voltage input from an AC power source and outputting the rectified voltage $V_{rec}$; an LED drive controller 220 sequentially driving a plurality of light emitting groups 310~340 included in a light emitting unit 300 according to a voltage level of the rectified voltage $V_{rec}$ output from the rectifier 210; and the light emitting unit 300 including the plurality of light emitting groups 310~340 sequentially driven by the LED drive controller 220. In the LED lighting apparatus shown in FIG. 3A, the light emitting unit 300 includes four light emitting groups 310~340, and each of the light emitting groups 310~340 includes two LEDs connected in series. The number of light emitting groups in the light emitting unit 300, the number of LEDs in each of the light emitting groups, and the connection relationship between the LEDs in each of the light emitting groups, such as series connection, parallel connection or series-parallel connection, may be changed in various ways according to embodiments. Herein, for convenience of description and understanding, the invention will be descried with reference to the embodiment shown in FIG. 3A.

Figure 2:
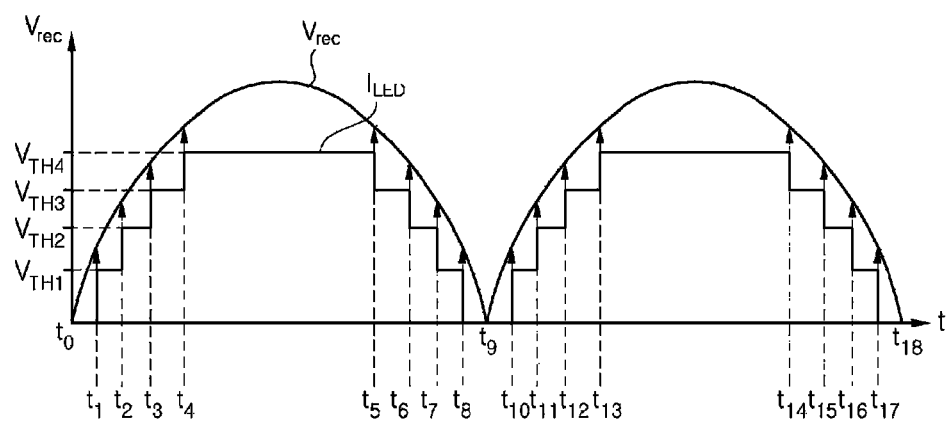
FIG. 2 is a waveform diagram of rectified voltage and LED driving current of the AC LED lighting apparatus of FIG. 1.
Figure 3B:
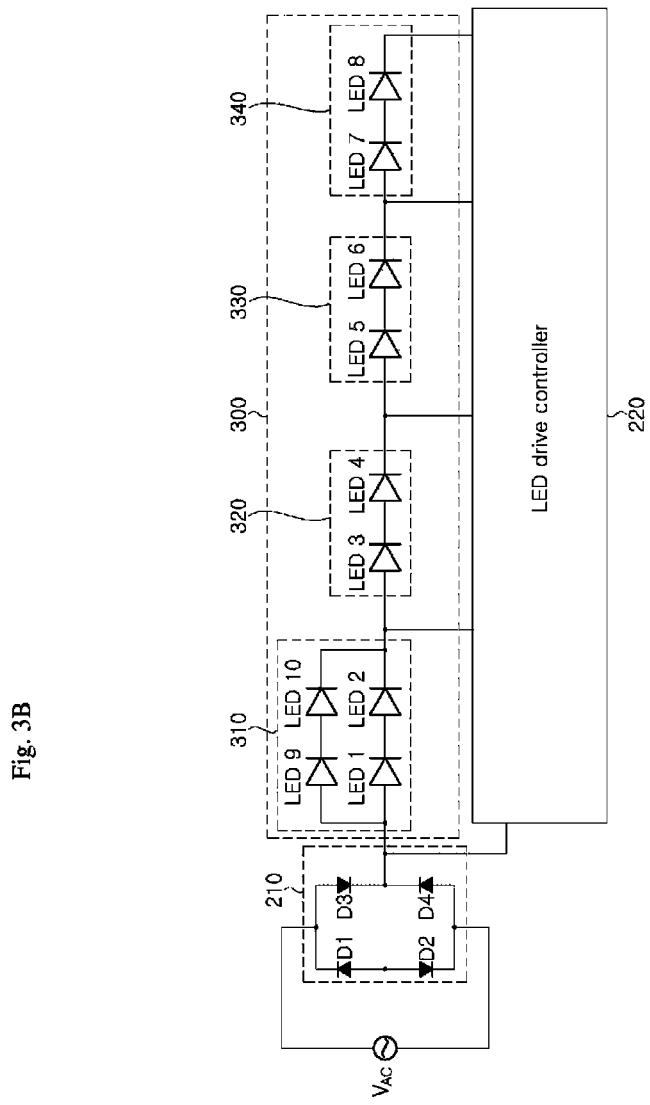
FIG. 3B is a block diagram of the AC LED lighting apparatus shown in FIG. 3A, which further includes two LEDs connected through a connection structure according to one exemplary embodiment of the present invention.

FIG. 3B is a block diagram of the AC LED lighting apparatus shown in FIG. 3A, which further includes two LEDs connected through a connection structure according to one exemplary embodiment of the invention. Referring to FIG. 3B, a first light emitting group 310 is constituted by a first string which includes a first LED (LED 1) and a second LED (LED 2) connected in series, and a second string which is connected in parallel to the first string and includes newly added LEDs, that is, a ninth LED (LED 9) and a tenth LED (LED 10) connected in series. In other words, the two newly added LEDs (ninth LED (LED 9) and tenth LED (LED 10)) are connected in parallel to the first string 310 which includes the first and second LEDs (LED 1, LED 2). Referring again to FIG. 2, the first light emitting group 310 is turned on for a duration (t1~t8) and thus has the longest operating duration in a single cycle of rectified voltage $V_{rec}$; a second light emitting group 320 is turned on for a duration (t2~t7) and thus has the second longest operating duration in a single cycle of rectified voltage $V_{rec}$; a third light emitting group 330 is turned on for a duration (t3~t6) and thus has the third longest operating duration in a single cycle of rectified voltage $V_{rec}$; and a fourth light emitting group 340 is turned on for a duration (t4~t5) and thus has the shortest operating duration in a single cycle of rectified voltage $V_{rec}$. Thus, in the case of adding a new sting to increase luminous flux, light emitting groups may be added in order of the first light emitting group 310, the second light emitting group 320, the third light emitting group 330 and the fourth light emitting group 340 in order to obtain efficient improvement in luminous flux of the LED lighting apparatus 1000. Accordingly, in the embodiment shown in FIG. 3B, the first to fourth light emitting groups 310~340 are constituted using 10 LEDs, in which the first light emitting group 310 having the longest operation duration is constituted by two strings in order to achieve efficient improvement in overall luminous flux of the LED lighting apparatus 1000.

Figure 3C:
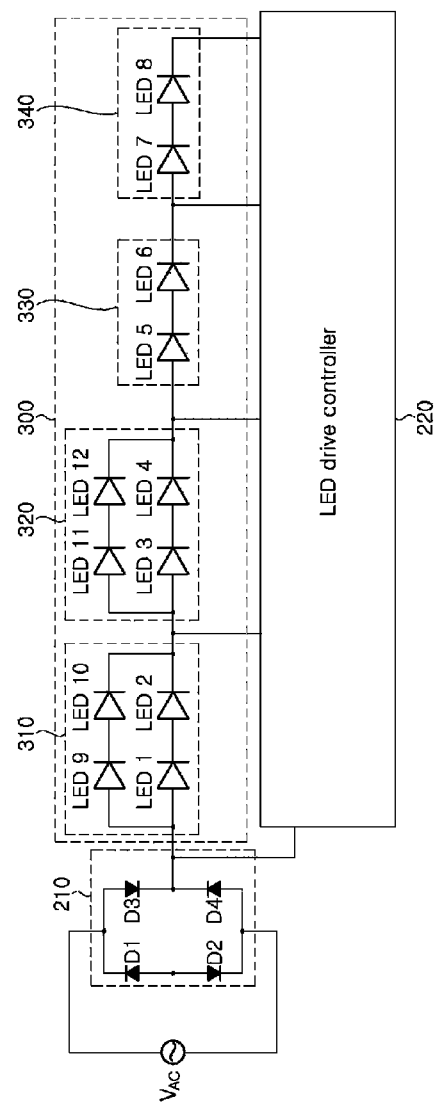
FIG. 3C is a block diagram of the AC LED lighting apparatus shown in FIG. 3A, which further includes four LEDs through the connection structure according to the exemplary embodiment of the present invention.
Figure 3D:
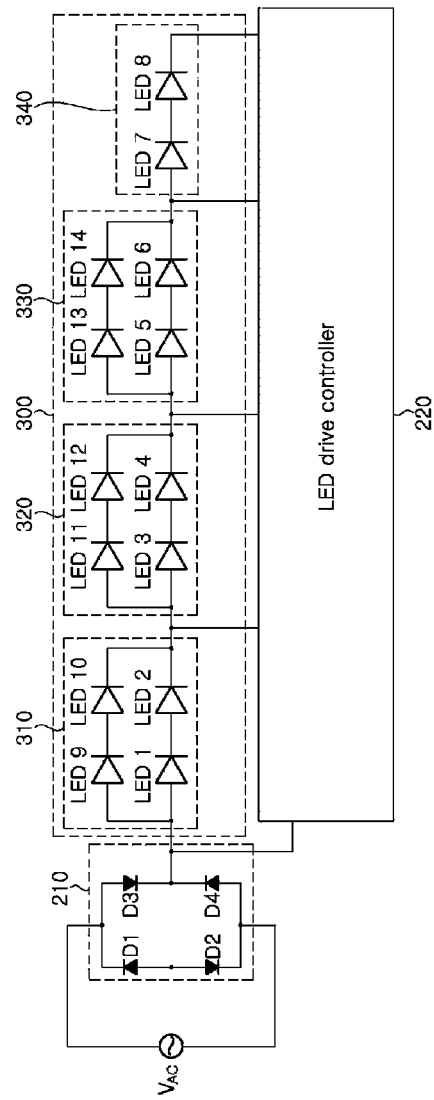
FIG. 3D is a block diagram of the AC LED lighting apparatus shown in FIG. 3A, which further includes six LEDs through the connection structure according to the exemplary embodiment of the present invention.

FIG. 3C is a block diagram of the AC LED lighting apparatus shown in FIG. 3A, which further includes four LEDs through the connection structure according to the exemplary embodiment, and FIG. 3D is a block diagram of the AC LED lighting apparatus shown in FIG. 3A, which further includes six LEDs through the connection structure according to the exemplary embodiment. As shown in FIG. 3C, when 4 LEDs (ninth LED (LED 9) to twelfth LED (LED 12)) are added to the lighting apparatus, the ninth LED (LED 9) and the tenth LED (LED 10) are connected in series as the second string, which in turn is connected in parallel to the existing first light emitting group 310, and the eleventh LED (LED 11) and the twelfth LED (LED 12) are connected in series as the second string, which in turn is connected in parallel to the existing second light emitting group 320. Accordingly, as each of the first light emitting group 310 having the longest operating duration and the second light emitting group 320 having the second longest operating duration is constituted by two strings, the overall luminous flux of the LED lighting apparatus 1000 can be efficiently improved. Likewise, as shown in FIG. 3D, when 6 LEDs (ninth LED (LED 9) to fifteenth LED (LED 14)) are added to the lighting apparatus, the ninth LED (LED 9) and the tenth LED (LED 10) are connected in series as the second string, which in turn is connected in parallel to the existing first light emitting group 310; the eleventh LED (LED 11) and the twelfth LED (LED 12) are connected in series as the second string, which in turn is connected in parallel to the existing second light emitting group 320; and the thirteenth LED (LED 13) and the fourteenth LED (LED 14) are connected in series as the second string, which in turn is connected in parallel to the existing third light emitting group 330. Accordingly, as each of the first to third light emitting groups 310 to 330 and the fourth light emitting group 340 having the shortest operating duration is constituted by two strings, the overall luminous flux of the LED lighting apparatus 1000 can be efficiently improved.

Figure 4A:
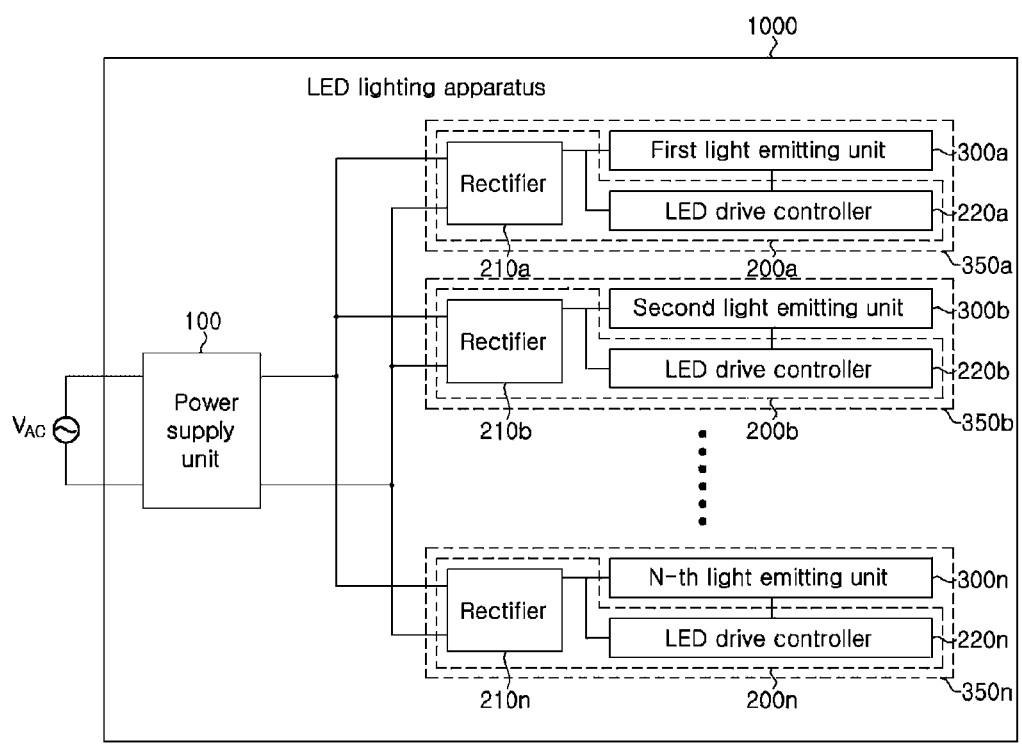
FIG. 4A is a block diagram of an AC LED lighting apparatus according to one exemplary embodiment of the present invention.
Figure 4B:
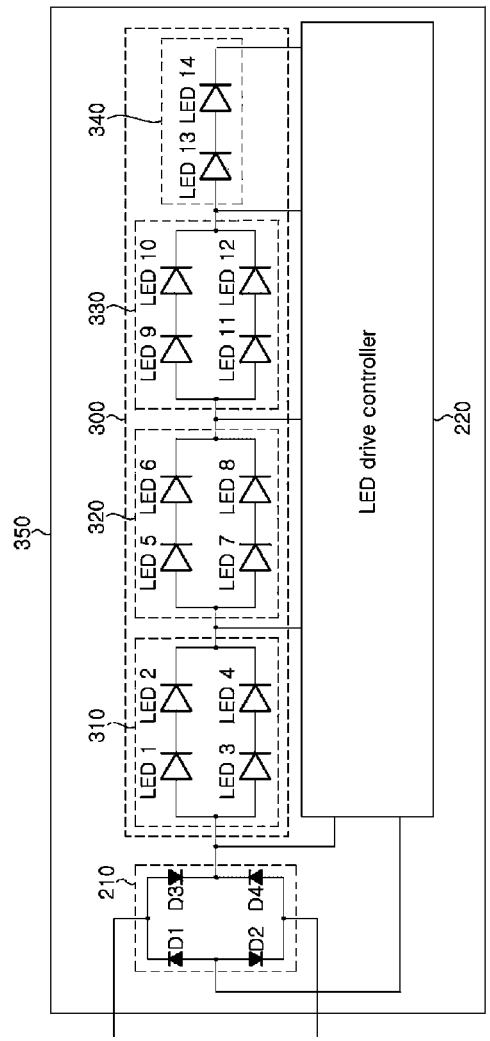
FIG. 4B is a detailed block diagram of a light emitting block among light emitting blocks shown in FIG. 4A.

FIG. 4A is a block diagram of an AC LED lighting apparatus according to one exemplary embodiment of the invention, and FIG. 4B is a detailed block diagram of a light emitting block among light emitting blocks shown in FIG. 4A. Next, the constitution and functions of the LED lighting apparatus 1000 according to the embodiment of the invention will be briefly described with reference to FIG. 4A and FIG. 4B.

As shown in FIG. 4A, the LED lighting apparatus 1000 according to the embodiment includes a circuit board (not shown in FIGS. 4A and 4B, see 400 in FIG. 5) may include a power supply unit 100, and n light emitting blocks (n being a positive integer ≥2) each connected in parallel to the power supply unit 100, that is, a first light emitting block 350a to an n-th light emitting block 350n.

The circuit board 400 is provided with a plurality of LEDs and a plurality of LED drive ICs 200a~200n constituting the first to n-th light emitting blocks 350a to 350n, and is formed with a patterned circuit for electrical connection of all components. As the circuit board, any typical circuit board such as a printed circuit board (PCB) and the like known in the art may be used.

The power supply unit 100 is connected to an external AC power source and supplies AC voltage ($V_{AC}$) applied from the external AC power source to the n light emitting blocks 350a-350n disposed on the circuit board. The power supply unit 100 may include a connector (not shown), for example, a plug, to be connected to an external AC power source and a power line (not shown) to deliver AC power applied through the connector to the circuit board 400. The power line of the power supply unit 100 is connected to a power input pattern of the circuit board 400. In some exemplary embodiments, such a power supply unit 100 may further include a surge protection circuit, such as a fuse (not shown), which protects the circuit board 400 and the plurality of LED and the plurality of LED drive ICs 200a-200n mounted on the circuit board.

Each of the first to n-th light emitting blocks 350a to 350n is placed in a predetermined pattern on a certain region on the circuit board 400 and is driven by AC voltage applied through the power supply unit 100. The first to n-th light emitting blocks 350a to 350n are constituted in the same manner in terms of the number of light emitting groups, the number of LEDs and connection between LEDs in each light emitting group, and arrangement of the light emitting groups. Thus, the first to n-th light emitting blocks 350a to 350n will be described with reference to a certain light emitting block 350.

The light emitting block 350 may include a rectifier 210, an LED drive controller 220, and a light emitting unit 300. The rectifier 210 and the LED drive controller 220 may be realized as a single integrated circuit (IC) to form an LED drive IC 200.

Referring to FIG. 4B, the rectifier 210 constituting the light emitting block 350 according to one embodiment may be a full-wave rectification circuit, which includes four diodes D1~D4 connected to each other in a full bridge manner. The rectifier 210 generates a rectified voltage $V_{rec}$ through full-wave rectification of AC voltage $V_{AC}$ supplied through the power supply unit 100, and outputs the rectified voltage $V_{rec}$ to the light emitting unit 300 and the LED drive controller 220. In the light emitting apparatus according to the embodiment shown in FIGS. 4A and 4B, each of the light emitting blocks 350 includes a single rectifier 210. However, it should be understood that the LED lighting apparatus 1000 may include a single rectifier, to which each of the light emitting blocks 350 is connected in parallel to receive rectified voltage $V_{rec}$ from the rectifier.

The light emitting unit 300 may include m light emitting groups (m being a is positive integer ≥2) each including at least one LED, that is, first to m-th light emitting groups, each of which is sequentially driven under control of the LED drive controller 220. The number of light emitting groups included in the light emitting unit 300 and/or the number of LEDs in each of the light emitting groups may be changed in various ways, as needed. Referring to FIG. 4B, four light emitting groups from a first light emitting group 310 to a fourth light emitting group 340 may be provided to the light emitting unit 300. In the embodiment of FIG. 4B, the light emitting unit 300 includes 14 LEDs as in the embodiment shown in FIG. 3D. Thus, the first light emitting group 310 is composed of a first string which includes a first LED (LED 1) and a second LED (LED 2) connected in series, and a second string which is connected in parallel to the first string and includes a third LED (LED 3) and a fourth LED (LED 4) connected in series. In addition, the second light emitting group 320 is composed of a first string which includes a fifth LED (LED 5) and a sixth LED (LED 6) connected in series, and a second string which is connected in parallel to the first string and includes a seventh LED (LED 7) and an eighth LED (LED 8) connected in series. Further, the third light emitting group 330 is composed of a first string which includes a ninth LED (LED 9) and a tenth LED (LED 10) connected in series, and a second string which is connected in parallel to the first string and includes an eleventh LED (LED 11) and a twelfth LED (LED 12) connected in series. On the other hand, the fourth light emitting group 340 is only composed of a first string which includes a thirteenth LED (LED 13) and a fourteenth LED (LED 14) connected in series. Such constitution of the light emitting groups 310-340 according to the exemplary embodiments is designed to achieve efficient improvement of luminous flux of the LED light emitting apparatus 100 using a limited number of LEDs, as described above. Thus, in the embodiment shown in FIG. 4B, the first to fourth light emitting groups 310 to 340 were created using 14 LEDs, wherein the fourth light is emitting group 340 is composed of a single string, thereby efficiently improving luminous flux of the overall LED lighting apparatus 1000. With this configuration, it can be experimentally ascertained that the luminous flux of the LED lighting apparatus 1000 according to the embodiment of the invention is similar to that of an LED light emitting apparatus wherein first to fourth light emitting groups 310 to 340 are composed of sixteen LEDs (each of the first to fourth light emitting group being composed of two strings connected in parallel and each including two LEDs connected in series). Hereinafter, although the lighting apparatus according to the invention will be described with reference to the embodiment shown in FIG. 4B for convenience of description, the number of light emitting groups in the light emitting unit 300, the number of LEDs in each of the light emitting groups and the number of strings connected in parallel to each other in each of the light emitting groups may be modified in various ways. However, despite such modification, it will be apparent to those skilled in the art that such modification falls within the scope of the invention so long as the modification includes the subject matter of the invention.

The LED drive controller 220 is configured to determine a voltage level of the rectified voltage $V_{rec}$ applied from the rectifier 210 and to sequentially drive the first light emitting group 310 to the fourth light emitting group 340 according to the voltage level of the rectified voltage $V_{rec}$. Referring again to FIG. 2, in durations in which the voltage level of the rectified voltage $V_{rec}$ is greater than or equal to a first threshold voltage $V_{TH1}$ and is less than a second threshold voltage $V_{TH2}$ (in durations of t1~t2 and t7~t8 in a single cycle of the rectified voltage), the LED drive controller 220 allows only the first light emitting group 310 to be driven. Further, in durations in which the voltage level of the rectified voltage $V_{rec}$ is greater than or equal to the second threshold voltage $V_{TH2}$ and is less than a third threshold voltage $V_{TH3}$ (in is durations of t2~t3 and t6~t7 in a single cycle of the rectified voltage), the LED drive controller 220 allows the first light emitting group 310 and the second light emitting group 320 to be driven. Further, in durations in which the voltage level of the rectified voltage $V_{rec}$ is greater than or equal to the third threshold voltage $V_{TH3}$ and less than a fourth threshold voltage $V_{TH4}$ (in durations of t3~t4 and t5~t6 in a single cycle of the rectified voltage), the LED drive controller 220 allows the first to third light emitting groups 310, 320, 330 to be driven. Further, in durations in which the voltage level of the rectified voltage $V_{rec}$ is greater than or equal to the fourth threshold voltage $V_{TH4}$ (during t4~t5 in a single cycle of the rectified voltage), the LED drive controller 220 allows all of the first to fourth light emitting groups 310, 320, 330, 340 to be driven.

FIG. 5 is a layout diagram of a circuit board and LEDs disposed on the circuit board in an AC LED lighting apparatus according to one exemplary embodiment of the invention. Although the circuit board 400 is illustrated as having a circular shape in the embodiment shown in FIG. 5, the present invention is not limited thereto and the circuit board may have any shape including a triangular, rectangular, pentagonal or hexagonal shape, as needed. In addition, according to the embodiment, the circuit board 400 may be formed at a center thereof with a hollow hole, through which a power line extending from the power supply unit 100 is connected to a power input pattern of the circuit board 400. In this configuration, the power supply unit 100 may be disposed around the center of the circuit board 400, preferably around the center of the circuit board at an opposite side to the side of the circuit board shown in FIG. 5. This configuration is aimed at minimizing noise generation and power consumption by providing as a short power line as possible. Further, a plurality of LED drive ICs 200 may be disposed adjacent to the center of the circuit board 400 to be arranged as near the power supply unit 100 as possible. This layout is aimed at minimizing noise generation and power consumption by the power line by minimizing the distances between the plurality of LED drive ICs 200 and the power supply unit 100. Further, when the layout of the LED drive ICs 200 is selected in this way, a layout design of the plurality of LEDs within the light emitting block 350 can be easily obtained as compared with the case where the plurality of LED drive ICs 200 is arranged at an outer periphery of the circuit board 400.

In the embodiment shown in FIG. 5, the circular circuit board 400 is divided into 8 arc sections arranged about the center of the circuit board 400 and having the same area, such that first to eighth light emitting blocks 350a to 350h are arranged in the 8 arc sections, respectively. As can be seen from the embodiment of FIG. 5, the first to eighth light emitting blocks 350a to 350h may be radially arranged on a concentric circle about the center of the circuit board 400. In addition, the first LED drive IC 200a to eighth LED drive IC 200h in each of the light emitting blocks 350 may be disposed adjacent to the center of the circuit board 400. Further, in the embodiment of FIG. 5, the 8 LED drive ICs 200a~200h and the plurality of LEDs are illustrated as being mounted on the same plane of the circuit board 400. However, the 8 LED drive ICs 200a~200h and the plurality of LEDs may also be mounted on different planes of the circuit board 400, as needed. In this embodiment, the 8 LED drive ICs 200a~200h may be mounted on a rear side of the circuit board 400, as shown in FIG. 5.

In addition, in the embodiment of FIG. 5, it can be seen that the first to eighth light emitting blocks 350a to 350h are disposed in the counterclockwise direction on the circuit board 400. However, the present invention is not limited thereto. That is, it should be understood that in some exemplary embodiments, the first to eighth light emitting blocks 350a to 350h may also be disposed in the clockwise direction on the circuit board 400.

In the embodiment of FIG. 5, since each of the first to eighth light emitting blocks 350a to 350h have the same configuration in terms of the shape and area thereof on the circuit board 400, and the arrangement of the LED drive ICs 200 and LEDs in each of the light emitting blocks excluding the positions thereof on the circuit board 400, the configuration of the light emitting blocks will be described in more detail with reference to the first light emitting block 350a. Since the region of the circuit board 400 on which the first light emitting block 350a is disposed has an arc shape, the first LED drive IC 200a is placed a first distance from the center of the circuit board 400; two LEDs are placed on a concentric circle (first row) separated a second distance (greater than the first distance) from the center of the circuit board 400 and are equally spaced along the concentric circle; three LEDs are placed on a concentric circle (second row) separated a third distance (greater than the second distance) from the center of the circuit board 400 and are arranged at constant intervals from each other; four LEDs are placed on a concentric circle (third row) separated a fourth distance (greater than the third distance) from the center of the circuit board 400 and are arranged at constant intervals from each other; and five LEDs are placed on a concentric circle (fourth row) separated a fifth distance (greater than the fourth distance) from the center of the circuit board 400 and are arranged at constant intervals from each other. Accordingly, fourteen LEDs are generally arranged in an arc shape, with the first LED drive IC 200a placed at a vertex of the arc shape. As described above, such an arc-shaped arrangement of the LEDs is provided due to the arc shape of the region of the circuit board 400 on which the first light emitting block 350a is disposed. Thus, the LED arrangement may be changed in various ways according to the overall shape of the circuit board 400 and the shapes of the regions on which the light emitting blocks are disposed. For example, when the circuit board 400 has a rectangular shape and the region of the circuit board 400 on which the is first light emitting block 350a is disposed has a rectangular shape, the first light emitting block 350a may include a plurality of rows separated a predetermined distance from the center of the circuit board 400 and including the same number of LEDs. Furthermore, unless otherwise stated herein, it should be understood that the term "distance" or "distance" may indicate a similar distance or a general direction rather than a numerically or mathematically identical distance or direction. For example, the expression "two LEDs placed on a concentric circle separated a second distance from the center of the circuit board 400" does not mean that the two LEDs are necessarily placed at a numerically identical second distance from the center of the circuit board and includes the concept wherein each of the LEDs is placed a similar distance from the center of the circuit board. In the LED lighting apparatus 1000 according to this embodiment, LEDs in each of the light emitting blocks are grouped into the first light emitting group 310, the second light emitting group 320, the third light emitting group 330 and the fourth light emitting group 340, thereby allowing the LED lighting apparatus 1000 to have maximum luminous efficacy and good luminous uniformity. Next, various exemplary embodiments of LED arrangement for grouping LEDs into the first to fourth light emitting groups 310 to 340 in each of the light emitting blocks 350 will be described in more detail with reference to FIGS. 6 to 14.

Arrangement of the first to fourth light emitting groups 310 to 340 in the light emitting block 350 according to a first exemplary embodiment will now be described.

Figure 6:
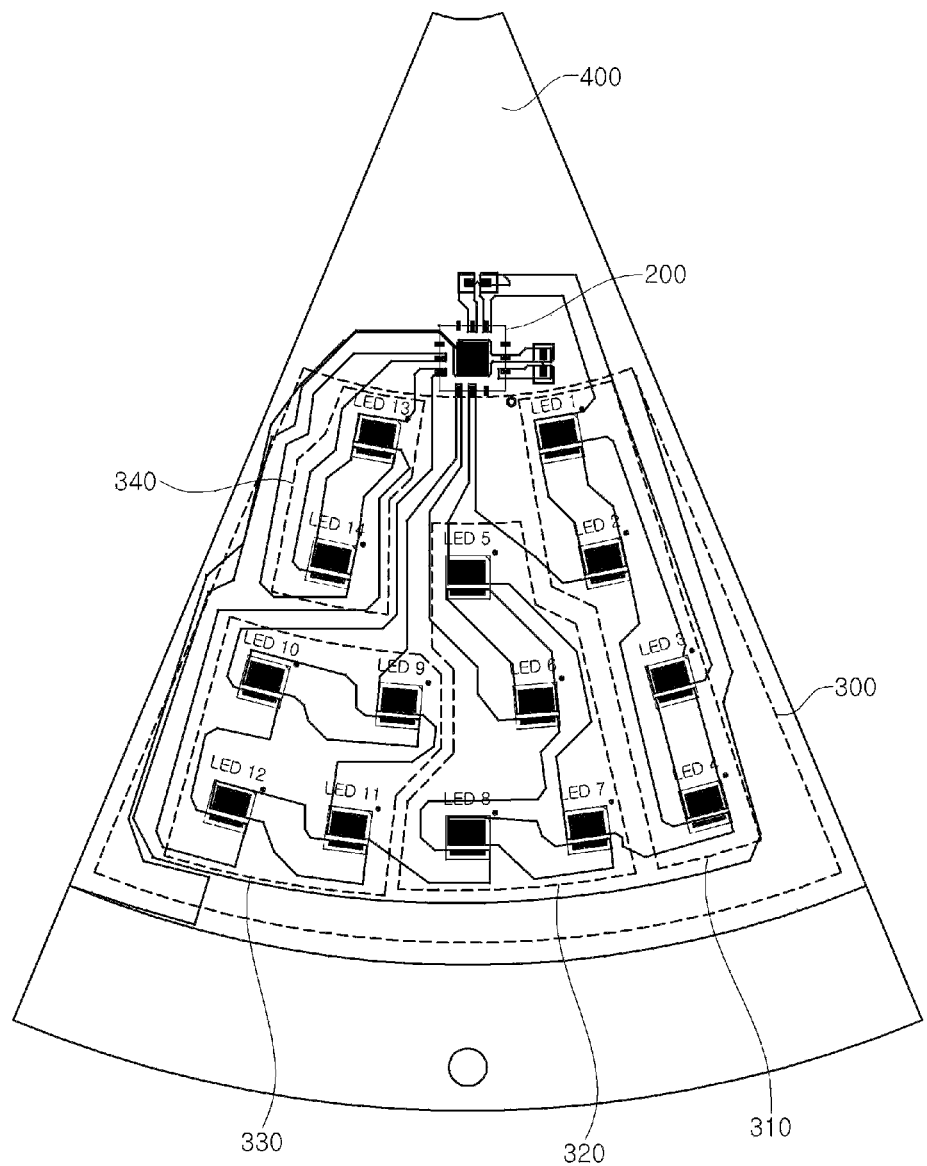
FIG. 6 is a detailed layout diagram of light emitting groups in one of the light emitting blocks shown in FIG. 5, according to one exemplary embodiment of the present invention.

FIG. 6 is a detailed layout diagram of light emitting groups in one of the light emitting blocks shown in FIG. 5 according to a first exemplary embodiment. In the first exemplary embodiment shown in FIG. 6, LEDs are arranged in the light emitting block 350 such that a first LED (LED 1), a second LED (LED 2), a third LED (LED 3) and a fourth LED (LED 4) placed at the rightmost side in the light emitting block 350 are grouped into a first is emitting group 310; a fifth LED (LED 5), a sixth LED (LED 6), a seventh LED (LED 7) and an eighth LED (LED 8) placed at the left of the first light emitting group 310 are grouped into a second light emitting group 320; a ninth LED (LED 9), a tenth LED (LED 10), an eleventh LED (LED 11) and a twelfth LED (LED 12) placed at the left of the second light emitting group 320 are grouped into a third light emitting group 330; and a thirteenth LED (LED 13) and a fourteenth LED (LED 14) placed at the left of the second light emitting group 320 and closer to the center of the circuit board than the third light emitting group 330 are grouped into a fourth light emitting group 340. Accordingly, in the LED arrangement according to the first exemplary embodiment of FIG. 6, generally, as the voltage level of the rectified voltage $V_{rec}$ increases, the first to fourth light emitting groups 310 to 340 are sequentially turned on in the clockwise direction, and as the voltage level of the rectified voltage $V_{rec}$ decreases, the fourth light emitting group 340 to the first light emitting group 310 are sequentially turned off in the counterclockwise direction. As used herein, a specific direction (for example, clockwise, counterclockwise and the like) means a general and overall on/off direction of the first to fourth light emitting groups 310 340 rather than indicating a specific orientation. Namely, in the embodiment shown in FIG. 6, the first to third light emitting groups 310 to 330 are sequentially turned on in the clockwise direction, whereas the fourth light emitting group 340 appears to be sequentially turned on in the clockwise direction with regard to the second light emitting group 320 and to be sequentially turned on towards the center of the circuit board 400 instead of the clockwise direction with regard to the third light emitting group 330. However, as used herein, the term 'clockwise direction' should be understood as including a general and overall on direction of the first to fourth light emitting groups 310 to 340 as in the embodiment shown in FIG. 6.

Accordingly, in the LED lighting apparatus 1000 including 8 light emitting blocks 8 as shown in FIG. 6, when the voltage level of the rectified voltage $V_{rec}$ continues to increase and reaches or exceeds a first threshold voltage $V_{TH1}$, the first light emitting group 310 of each of the first to eighth light emitting blocks 350a to 350h is turned on; when the voltage level of the rectified voltage $V_{rec}$ continues to increase and reaches or exceeds a second threshold voltage $V_{TH2}$, the second light emitting group 320 of each of the first to eighth light emitting blocks 350a to 350h is additionally turned on, so that the first and second light emitting groups 310, 320 are driven; when the voltage level of the rectified voltage $V_{rec}$ continues to increase and reaches a third threshold voltage $V_{TH3}$ or more, the third light emitting group 330 of each of the first to eighth light emitting blocks 350a to 350h is additionally turned on, so that the first light emitting group to the third light emitting group 330 are driven; and when the voltage level of the rectified voltage $V_{rec}$ continues to increase and reaches a fourth threshold voltage $V_{TH4}$ or more, the fourth light emitting group 340 of each of the first to eighth light emitting blocks 350a to 350h is additionally turned on, so that the first light emitting group to the fourth light emitting group 340 are driven. As described above, since the first to eighth light emitting blocks 350a to 350h are uniformly arranged in the same shape and area on the circuit board 400, the LED lighting apparatus 1000 including the 8 light emitting blocks, as shown in FIG. 6, may provide uniform distribution of light output according to the voltage level of the rectified voltage $V_{rec}$ even through a sequential driving manner.

Arrangement of the first to fourth light emitting groups 310 to 340 in the light emitting block 350 according to a second exemplary embodiment will now be described.

Figure 7:
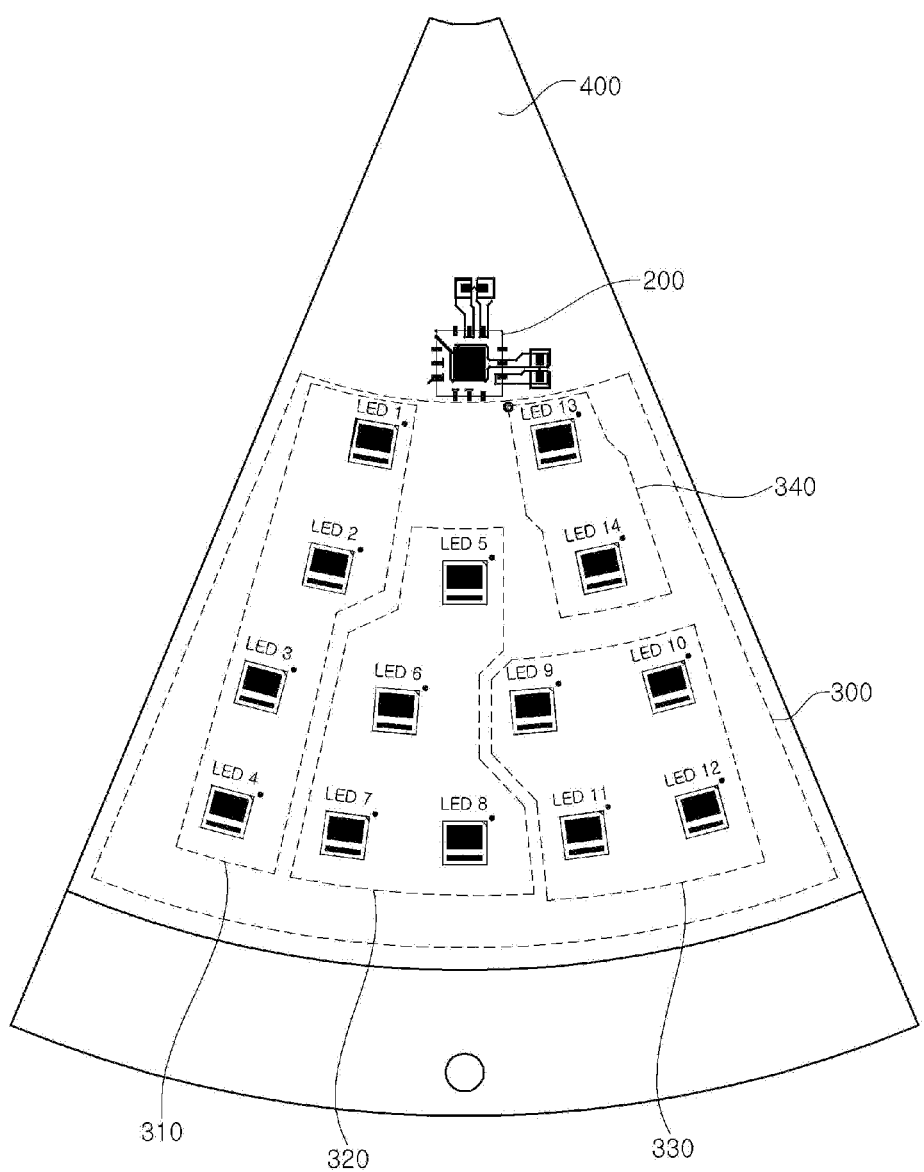
FIG. 7 is a detailed layout diagram of light emitting groups in one of the light emitting blocks shown in FIG. 5, according to another exemplary embodiment of the present invention.

FIG. 7 is a detailed layout diagram of light emitting groups in one of the light emitting blocks shown in FIG. 5 according to a second exemplary embodiment of the present invention. The arrangement according to the second exemplary embodiment of FIG. 7 is is different from that of the first exemplary embodiment of FIG. 6 in that the light emitting groups are turned on/off in an opposite direction to the direction of turning on/off the light emitting groups in the first exemplary embodiment. Specifically, in the second exemplary embodiment shown in FIG. 7, LEDs are arranged in the light emitting block 350 such that a first LED (LED 1), a second LED (LED 2), a third LED (LED 3) and a fourth LED (LED 4) placed at the leftmost side in the light emitting block 350 are grouped into a first light emitting group 310; a fifth LED (LED 5), a sixth LED (LED 6), a seventh LED (LED 7) and an eighth LED (LED 8) placed at the right of the first light emitting group 310 are grouped into a second light emitting group 320; a ninth LED (LED 9), a tenth LED (LED 10), an eleventh LED (LED 11) and a twelfth LED (LED 12) placed at the right of the second light emitting group 320 are grouped into a third light emitting group 330; and a thirteenth LED (LED 13) and a fourteenth LED (LED 14) placed at the right of the second light emitting group 320 and closer to the center of the circuit board than the third light emitting group 330 are grouped into a fourth light emitting group 340. Accordingly, in the second exemplary embodiment of FIG. 7, the LEDs are generally arranged in the light emitting block such that the first to fourth light emitting group 310 to 340 are sequentially turned on in the counterclockwise direction as the voltage level of the rectified voltage $V_{rec}$ increases, and the fourth light emitting group 340 to the first light emitting group 310 are sequentially turned off in the clockwise direction as the voltage level of the rectified voltage $V_{rec}$ decreases.

Arrangement of the first to fourth light emitting groups 310 to 340 in the light emitting block 350 according to a third exemplary embodiment will now be described.

Figure 8:
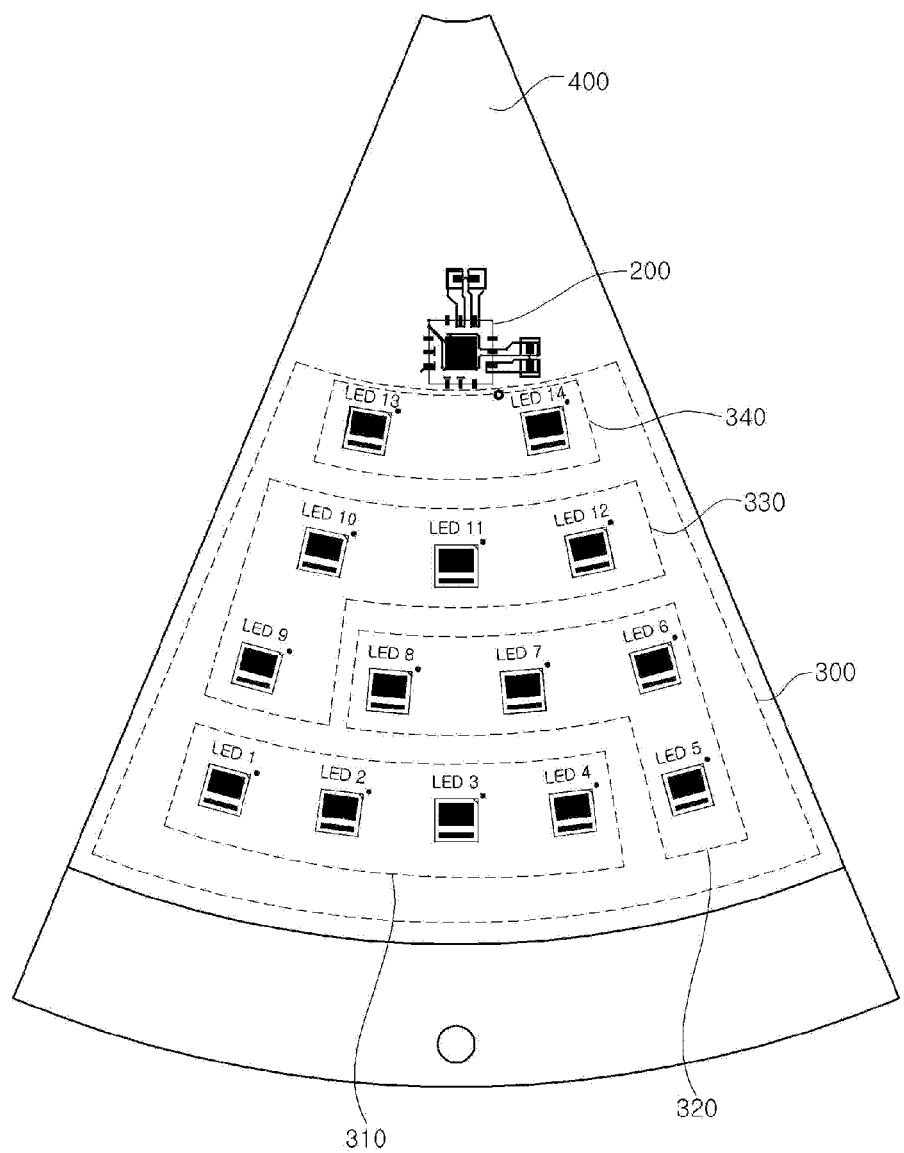
FIG. 8 is a detailed layout diagram of light emitting groups in one of the light emitting blocks shown in FIG. 5, according to a further exemplary embodiment of the present invention.

FIG. 8 is a detailed layout diagram of light emitting groups in one of the light emitting blocks shown in FIG. 5 according to a third exemplary embodiment of the present invention. In the third exemplary embodiment shown in FIG. 8, LEDs are arranged in the light emitting block 350 such that the first to fourth light emitting groups 310 to 340 are sequentially turned on in a direction from the periphery of the circuit board 400 towards the center thereof as the voltage level of the rectified voltage $V_{rec}$ increases, and the fourth light emitting group 340 to the first light emitting group 310 are sequentially turned off in a direction from the center of the circuit board 400 towards the periphery thereof as the voltage level of the rectified voltage $V_{rec}$ decreases. Accordingly, the LED lighting apparatus according to the embodiment in FIG. 4B may have LED arrangement wherein four LEDs are selected from among five LEDs placed at the farthest locations from the center of the circuit board 400 and are grouped as a first LED (LED 1), a second LED (LED 2), a third LED (LED 3) and a fourth LED (LED 4) to constitute a first light emitting group 310. In the embodiment shown in FIG. 8, the first light emitting group 310 is composed of the first LED (LED 1), the second LED (LED 2), the third LED (LED 3) and the fourth LED (LED 4) selected from the left side from among the outermost five LEDs (that is, five LEDs disposed on the fourth row). However, the present invention is not limited thereto. In some exemplary embodiments, the LEDs may be designated in an reverse order as the first LED (LED 1), the second LED (LED 2), the third LED (LED 3) and the fourth LED (LED 4), or otherwise four LEDs may be arbitrarily selected from among five outermost LEDs to be designated as the first LED (LED 1), the second LED (LED 2), the third LED (LED 3) and the fourth LED (LED 4). It should be noted that the subject matter of the invention is a general on/off direction of the first to fourth light emitting groups 310 to 340. In the following description, however, the invention will be described with reference to the embodiment shown in FIG. 8 for convenience of description.

Further, one LED placed at the rightmost side on the fourth row is designated as a fifth LED (LED 5), and three LEDs selected from the rightmost side of the third row to the right of the third row are designated as a sixth LED (LED 6), a seventh LED (LED 7) and an eighth LED (LED 8), respectively, thereby constituting a second light emitting group 320; one LED at the leftmost side of the third row is designated as a ninth LED (LED 9) and three LEDs from the leftmost side of the second row to the right of the second row are designated as a tenth LED (LED 10), an eleventh LED (LED 11) and a twelfth LED (LED 12), respectively, thereby constituting a third light emitting group 330; and two LEDs in the first row are designated as a thirteenth LED (LED 13) and a fourteenth LED (LED 14), respectively, thereby constituting a fourth light emitting group 340.

Accordingly, in the third exemplary embodiment of FIG. 8, the LEDs are generally arranged in the light emitting block 350 such that the first to fourth light emitting groups 310 to 340 are sequentially turned on in the direction from the periphery of the circuit board 400 towards the center thereof as the voltage level of the rectified voltage $V_{rec}$ increases, and the fourth light emitting group 340 to the first light emitting group 310 are sequentially turned off in a direction from the center of the circuit board 400 towards the periphery thereof as the voltage level of the rectified voltage $V_{rec}$ decreases.

On the other hand, unlike the third exemplary embodiment of FIG. 4B, in modification of this embodiment, the first light emitting group 310 may be composed of five LEDs (first to fifth LEDs (LED 1 to LED 5)) placed on the fourth row and connected in series; the second light emitting group 320 may be composed of four LEDs (sixth to ninth LEDs (LED 6 to LED 9)) placed on the third row and connected in series; the third light emitting group 330 may be composed of three LEDs (tenth to twelfth LEDs (LED 10 to LED 12)) placed on the second row and connected in series; and the fourth light emitting group 340 may be composed is of two LEDs (thirteenth LED (LED 13) and fourteenth LED (LED 14)) placed on the first row and connected in series. In this embodiment, since the first to fourth light emitting groups 310 to 340 include different numbers of LEDs, each of the light emitting groups has a different forward voltage level. However, as the voltage level of the rectified voltage $V_{rec}$ increases, the first to fourth light emitting groups 310 to 340 disposed on each of the fourth, third, second and first rows may be sequentially turned on, and as the voltage level of the rectified voltage $V_{rec}$ decreases, the fourth to first light emitting groups 340 to 310 disposed on each of the first, second, third and fourth rows may be sequentially turned off.

Arrangement of the first to fourth light emitting groups 310 to 340 in the light emitting block 350 according to a fourth exemplary embodiment will now be described.

Figure 9:
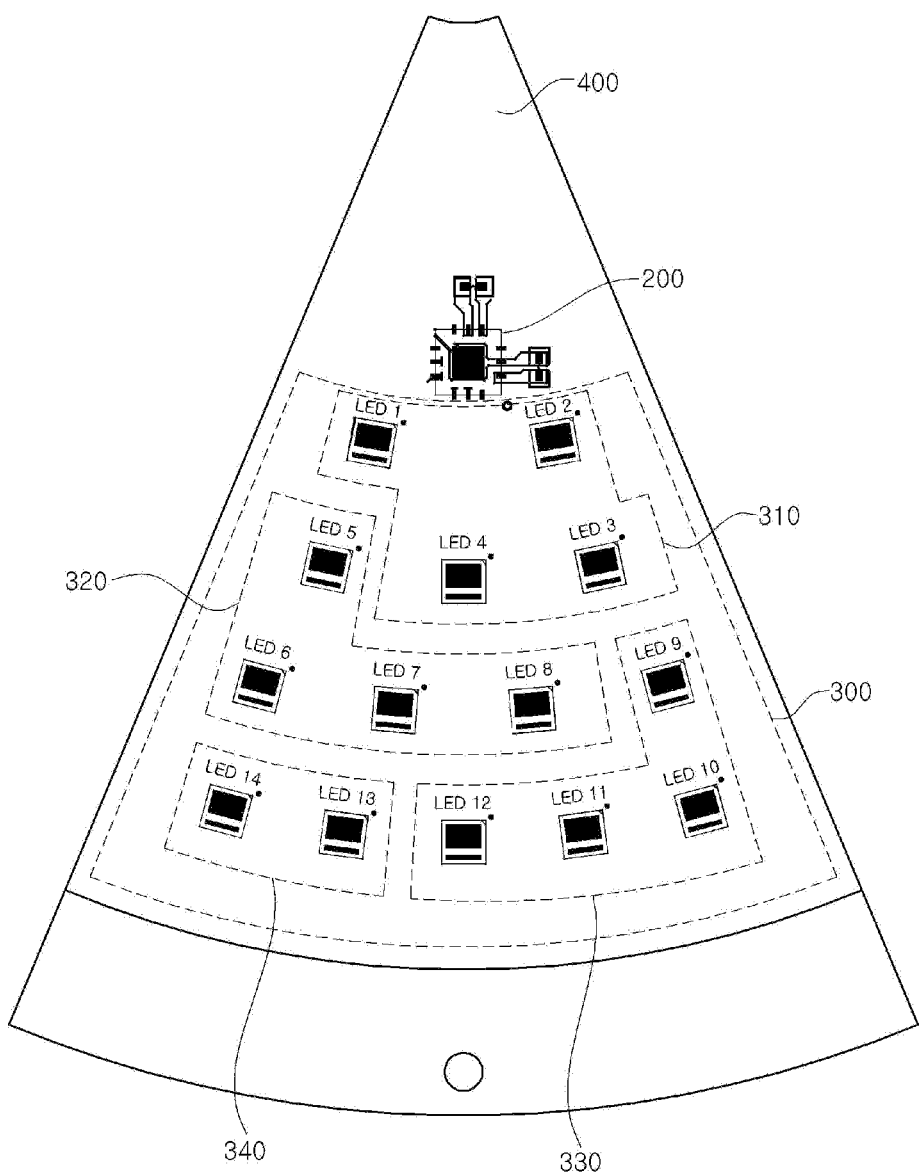
FIG. 9 is a detailed layout diagram of light emitting groups in light emitting blocks according to yet another embodiment of the present invention.

FIG. 9 is a detailed layout diagram of light emitting groups in light emitting blocks shown in FIG. 5 according to a fourth exemplary embodiment. The LED arrangement according to the fourth exemplary embodiment of FIG. 9 is different from that of the first exemplary embodiment of FIG. 8 in that the first to fourth light emitting groups 310 to 340 are turned on/off in reverse order to the direction of turning on/off the light emitting groups in the arrangement shown in FIG. 8. Thus, in the fourth exemplary embodiment shown in FIG. 9, LEDs are arranged in the light emitting block 350 such that two LEDs placed in the first row are respectively designated as first and second LEDs (LED 1, LED 2), and two LEDs selected from among three LEDs on the second row are respectively designated as third and fourth LEDs (LED 3, LED 4), thereby constituting a first light emitting group 310; one LED selected from among three LEDs placed on the second row is designated as a fifth LED (LED 5) and three LEDs selected from among four LEDs placed on the third row are respectively designated as a sixth LED (LED 6), a seventh LED (LED 7) and an eighth LED (LED 8), thereby constituting a is second light emitting group 320; one LED selected from among four LEDs placed on the third row is designated as a ninth LED (LED 9) and three LEDs selected from among five LEDs placed in the fourth row are respectively designated as a tenth LED (LED 10), an eleventh LED (LED 11) and a twelfth LED (LED 12), thereby constituting a third light emitting group 330; and the remaining two LEDs placed on the fourth row are respectively designated as a thirteenth LED (LED 13) and a fourteenth LED (LED 14), thereby constituting a fourth light emitting group 340. Accordingly, in the fourth exemplary embodiment of FIG. 9, the LEDs are generally arranged in the light emitting block 350 such that the first to fourth light emitting groups 310 to 340 are sequentially turned on in the direction from the center of the circuit board 400 towards the periphery thereof as the voltage level of the rectified voltage $V_{rec}$ increases, and the fourth light emitting group 340 to the first light emitting group 310 are sequentially turned off in the direction from the periphery of the circuit board 400 towards the center thereof as the voltage level of the rectified voltage $V_{rec}$ decreases.

In addition, like the modification of the embodiment shown in FIG. 8, the embodiment of FIG. 9 may be modified to have an LED arrangement such that the light emitting groups can be formed on the respective rows. In this modification, the first LED (LED 1) and the second LED (LED 2) placed on the first row are connected in series to constitute the first light emitting group 310; the third to fifth LEDs (LED 3 to LED 5) placed on the second row are connected in series to constitute the second light emitting group 320; the sixth to ninth LEDs (LED 6 to LED 9) placed are connected in series to constitute the third light emitting group 330; and the tenth to fourteenth LEDs (LED 10 to LED 14) placed on the fourth row are connected in series to constitute the fourth light emitting group 340.

Arrangement of the first to fourth light emitting groups 310 to 340 in the light is emitting block 350 according to a fifth exemplary embodiment will now be described.

Figure 10:
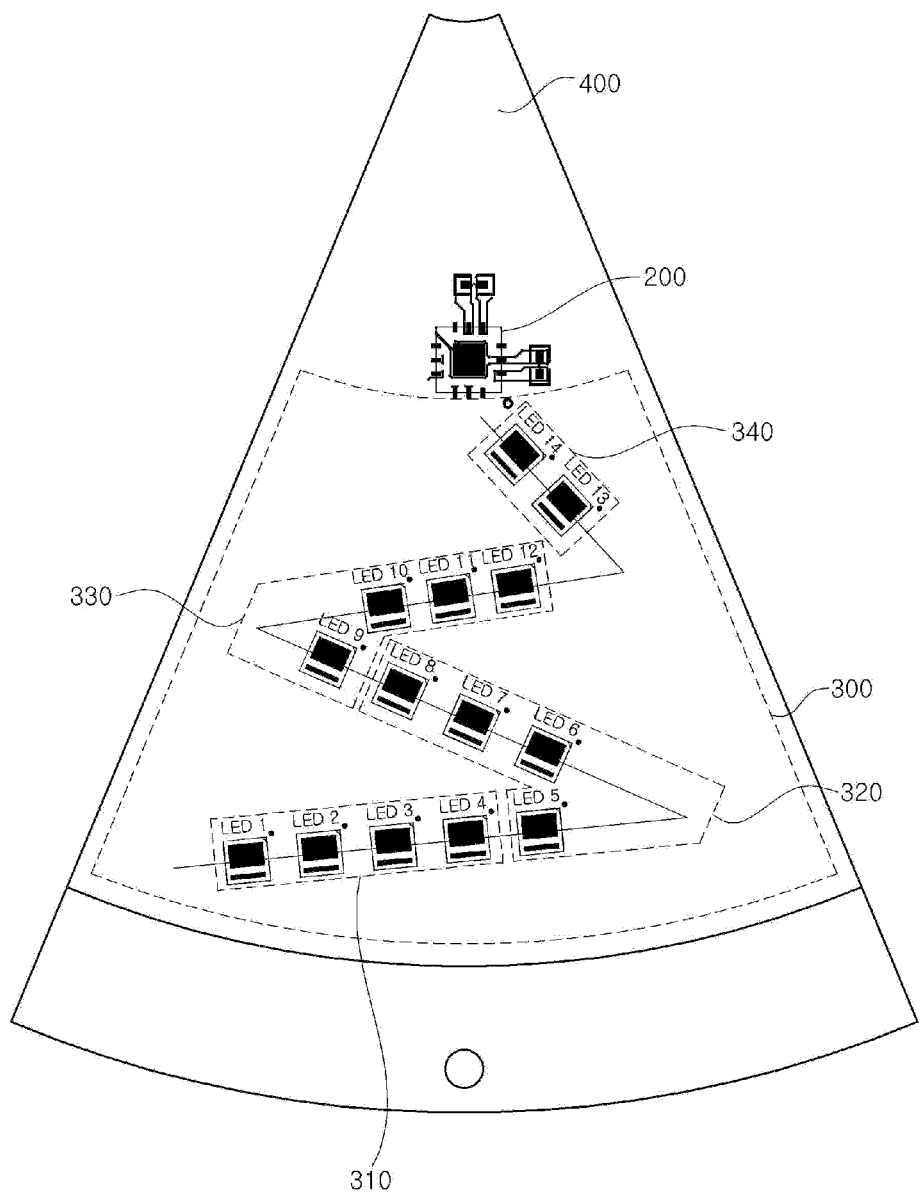
FIG. 10 is a detailed layout diagram of light emitting groups in light emitting blocks according to yet another embodiment of the present invention.

FIG. 10 is a detailed layout diagram of light emitting groups in light emitting blocks according to a fifth exemplary embodiment of the invention. Unlike the LED arrangement of FIG. 5 wherein the LED are disposed in the first to fourth rows, in the LED arrangement according to the fifth embodiment shown in FIG. 10, fourteen LEDs are disposed in a zigzag arrangement from the periphery of the circuit board 400 towards the center thereof. Note that lines connecting the LEDs to each other in the drawings are imaginary lines for explaining the zigzag arrangement of the LEDs rather than the connection relationship between the LEDs.

In the LED arrangement according to the fifth exemplary embodiment of FIG. 10, LEDs are disposed in the zigzag arrangement from the periphery of the circuit board 400 towards the center of the circuit board circuit board 400 to be grouped into first to fourth light emitting groups 310 to 340, such that the first light emitting group 310 to the fourth light emitting group 340 are sequentially turned on from the periphery of the circuit board 400 towards the center thereof as the voltage level of the rectified voltage Vrec increases, and the fourth light emitting group 340 to the first light emitting group 310 are sequentially turned off from the center of the circuit board 400 towards the periphery thereof as the voltage level of the rectified voltage Vrec decreases. Accordingly, LEDs constituting the first light emitting group 310 are arranged along an imaginary zigzag line such that one LED placed at the outermost side of the circuit board is designated as a first LED (LED 1), and the next LEDs are sequentially designated as second to fourth LEDs (LED 2, LED 3, LED 4), respectively. Likewise, LEDs constituting the second light emitting group 320 are arranged along an imaginary zigzag line such that, among the LEDs sequentially disposed in the zigzag arrangement along the imaginary is zigzag line towards the center of the circuit board, four LEDs are designated as fifth to eighth LEDs (LED 5, LED 6, LED 7, LED 8), respectively. Further, in a similar manner, ninth to twelfth LEDs (LED 9 to LED 12) constitute the third light emitting group 330, and a thirteenth LED (LED 13) and a fourteenth LED (LED 14) constitute the fourth light emitting group 340.

Arrangement of the first to fourth light emitting groups 310 to 340 in the light emitting block 350 according to a sixth exemplary embodiment will now be described.

Figure 11:
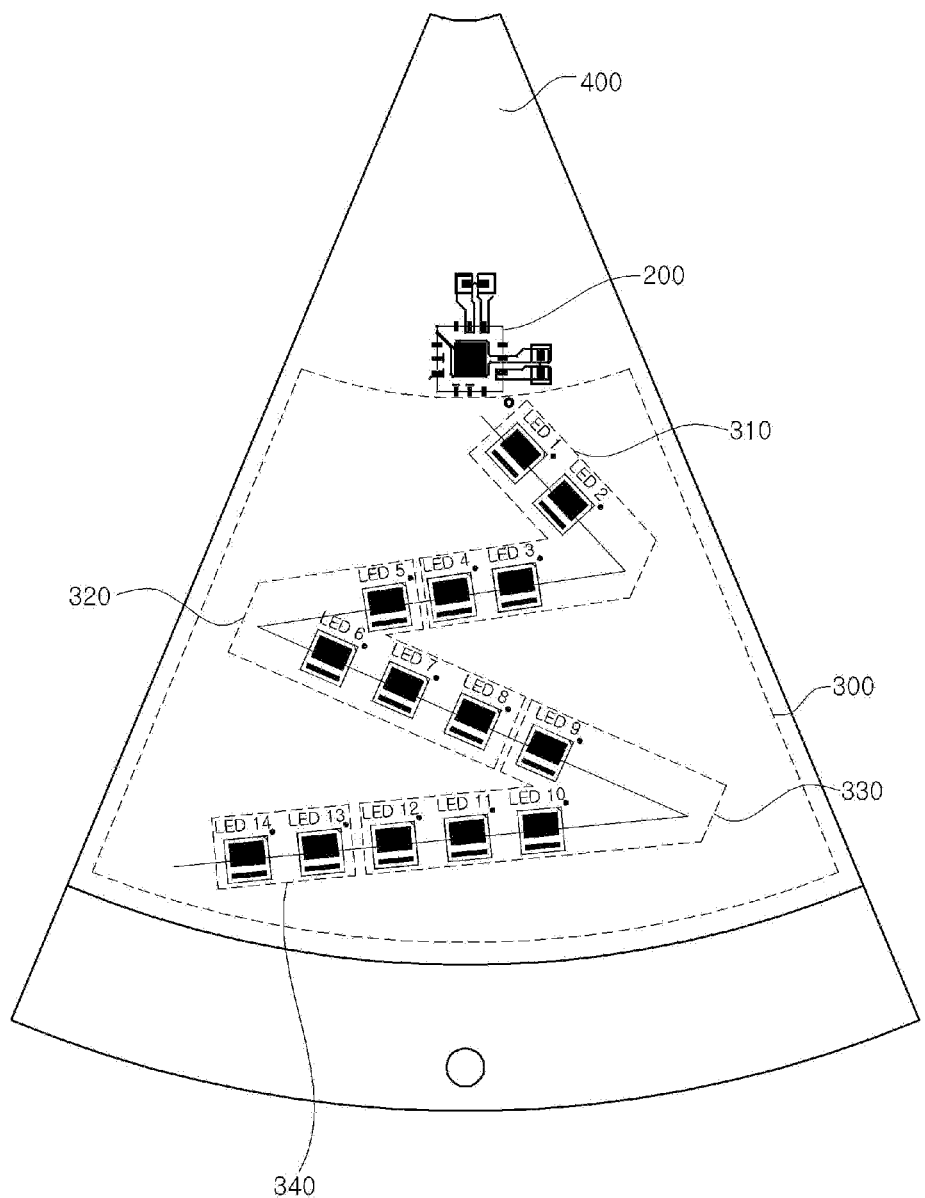
FIG. 11 is a detailed layout diagram of light emitting groups in light emitting blocks according to yet another embodiment of the present invention.

FIG. 11 is a detailed layout diagram of light emitting groups in light emitting blocks according to a sixth exemplary embodiment of the invention. In the sixth embodiment of FIG. 11, although LEDs are arranged in a similar manner to the LED arrangement according to the embodiment shown in FIG. 10, the LEDs are grouped in reverse order to the LED arrangement of the embodiment of FIG. 10. Thus, an LED placed at a location most adjacent to the center of the circuit board 400 is designated as a first LED (LED 1), and an LED placed at the outermost side of the circuit board 400 along an imaginary zigzag line is designated as a fourteenth LED (LED 14). Accordingly, in the LED arrangement according to this embodiment of FIG. 11, the first to fourth light emitting groups 310 to 340 arranged in the zigzag manner are sequentially turned on from the center of the circuit board 400 towards the periphery thereof as the voltage level of the rectified voltage Vrec increases, and the fourth light emitting group 340 to the first light emitting group 310 arranged in the zigzag manner are sequentially turned off from the periphery of the circuit board 400 towards the center thereof, as the voltage level of the rectified voltage Vrec decreases.

Arrangement of the first to fourth light emitting groups 310 to 340 in the light emitting block 350 according to a seventh exemplary embodiment will now be described.

Figure 12:
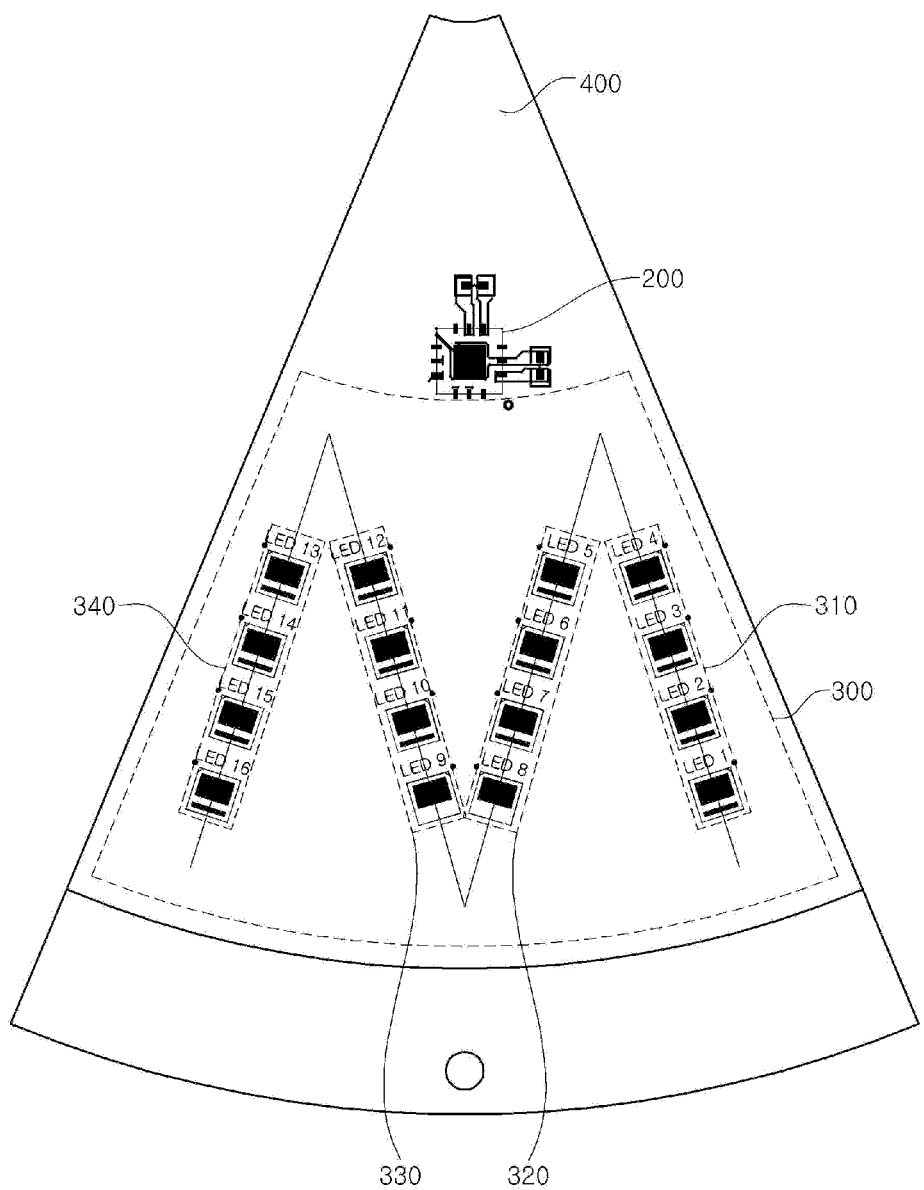
FIG. 12 is a detailed layout diagram of light emitting groups in light emitting blocks according to yet another embodiment of the present invention.

FIG. 12 is a detailed layout diagram of light emitting groups in light emitting is blocks according to a seventh exemplary embodiment of the invention. Unlike the first to sixth exemplary embodiments wherein each light emitting block 350 includes 14 LEDs, in an LED arrangement according to the embodiment of FIG. 12, each light emitting block 350 includes 16 LEDs. Each of first to fourth light emitting groups 310 to 340 may include four LEDs. In each of the light emitting groups, four LEDs may be connected in series, or otherwise, two stings each including two LEDs connected in series may be connected in parallel to constitute a light emitting group. In addition, it will be apparent to those skilled in the art that in modification of the embodiment shown in FIG. 12, fourteen LEDs may be provided to a single light emitting block 350. As described above, since the subject matter of the invention is in the direction of sequentially turning on/off the first to fourth light emitting groups 310 to 340 and in the arrangement thereof, it should be noted that the present invention is not limited to a detailed number of LEDs and various modifications and variations can be made as needed.

In the LED arrangement according to the seventh exemplary embodiment of FIG. 12, sixteen LEDs are arranged in the zigzag manner in the clockwise direction inside the light emitting block 350, such that the first to fourth light emitting groups 310 to 340 arranged in the zigzag manner are sequentially turned on in the clockwise direction as the voltage level of the rectified voltage Vrec increases, and the fourth light emitting group 340 to the first light emitting group 310 arranged in the zigzag manner are sequentially turned off in the counterclockwise direction as the voltage level of the rectified voltage Vrec decreases. Note that lines connecting the LEDs to each other in the drawings are imaginary lines for explaining the zigzag arrangement of the LEDs rather than the connection relationship between the LEDs. Accordingly, LEDs constituting the first light emitting group 310 are arranged along an imaginary zigzag line shown in FIG. 12 such that four LEDs placed at the rightmost side of the is circuit board are designated as a first LED (LED 1), a second LED (LED 2), a third LED (LED 3), and a fourth LED (LED 4), respectively. In addition, LEDs constituting the second light emitting group 320 are arranged along an imaginary zigzag line such that four LEDs placed immediately to the left of the first light emitting group 310 are designated as a fifth LED (LED 5), a sixth LED (LED 6), a seventh LED (LED 7), and an eighth LED (LED 8), respectively; LEDs constituting the third light emitting groups are arranged along an imaginary zigzag line such that four LEDs placed immediately to the left of the second light emitting group 320 are designated as a ninth LED (LED 9), a tenth LED (LED 10), an eleventh LED (LED 11), and a twelfth LED (LED 12), respectively; and LEDs constituting the fourth light emitting group 340 are arranged in an imaginary zigzag line such that four LEDs placed immediately to the left of the third light emitting group 330 are designated as a thirteenth LED (LED 13), a fourteenth LED (LED 14), a fifteenth LED (LED 15), and a sixteenth LED (LED 16), respectively. Thus, in the LED arrangement according to this embodiment of FIG. 12, the first to fourth light emitting groups 310 to 340 arranged in the zigzag manner are sequentially turned on in the clockwise direction, and the fourth light emitting group 340 to the first light emitting group 310 arranged in the zigzag manner are sequentially turned off in the counterclockwise direction.

Arrangement of the first to fourth light emitting groups 310 to 340 in the light emitting block 350 according to an eighth exemplary embodiment will now be described.

Figure 13:
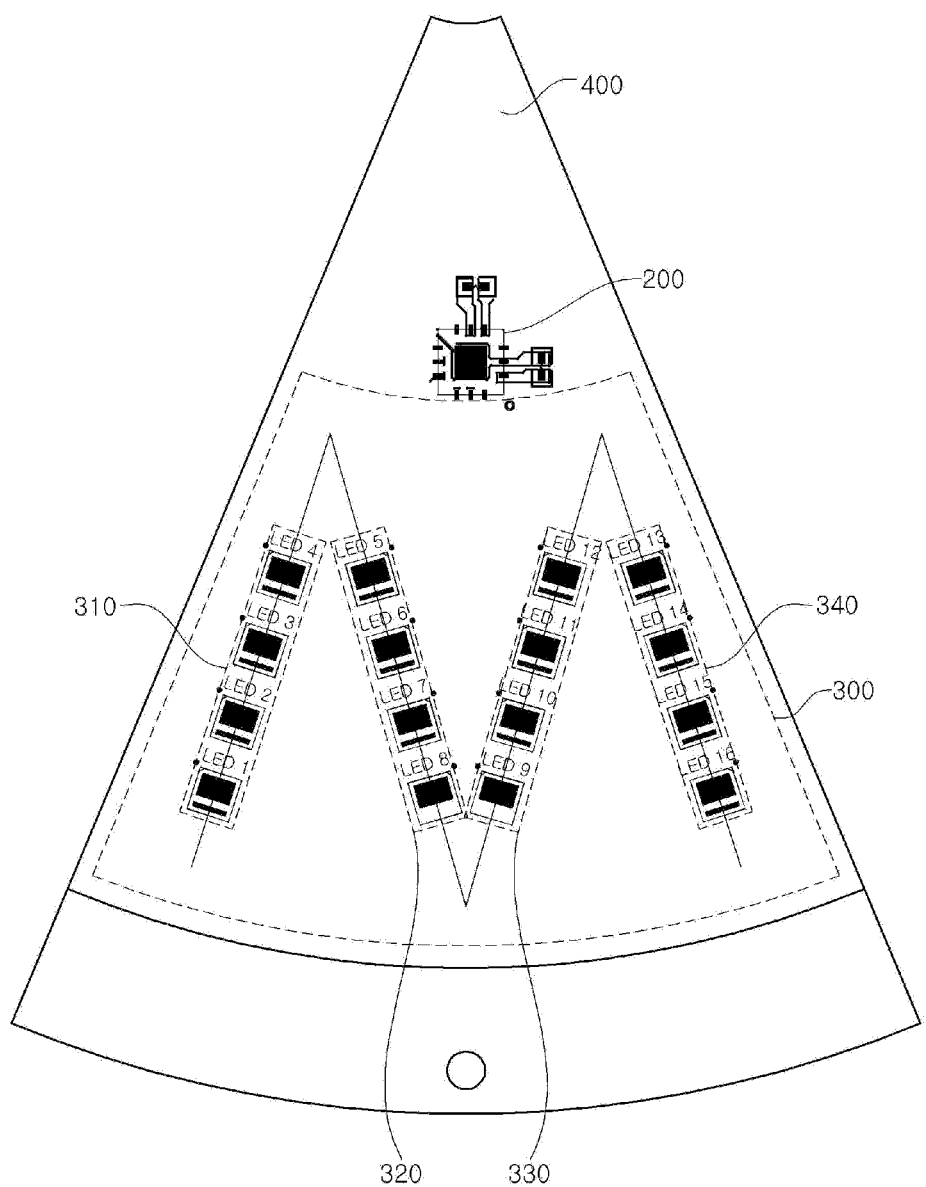
FIG. 13 is a detailed layout diagram of light emitting groups in light emitting blocks according to yet another embodiment of the present invention.

FIG. 13 is a detailed layout diagram of light emitting groups in light emitting blocks according to an eighth exemplary embodiment of the invention. In the eighth embodiment of FIG. 13, although LEDs are arranged in a similar manner to the LED arrangement according to the embodiment of FIG. 12, the LEDs are grouped in reverse order to the LED arrangement of the embodiment of FIG. 12. Thus, four LEDs placed at the leftmost side of the circuit board is along an imaginary zigzag line constitute a first light emitting group 310; four LEDs placed immediately to the right of the first light emitting group 310 constitute a second light emitting group 320; four LEDs placed immediately to the right of the second light emitting group 320 constitute a third light emitting group 330; and four LEDs placed immediately to the right of the third light emitting group 330 constitute a fourth light emitting group 340. Accordingly, in the LED arrangement according to the eighth embodiment of FIG. 13, the first to fourth light emitting groups 310 to 340 arranged in the zigzag manner are sequentially turned on in the counterclockwise direction, and the fourth light emitting group 340 to the first light emitting group 310 arranged in the zigzag manner are sequentially turned off in the clockwise direction.

Arrangement of the first to fourth light emitting groups 310 to 340 in the light emitting block 350 according to a ninth exemplary embodiment will now be described.

Figure 14:
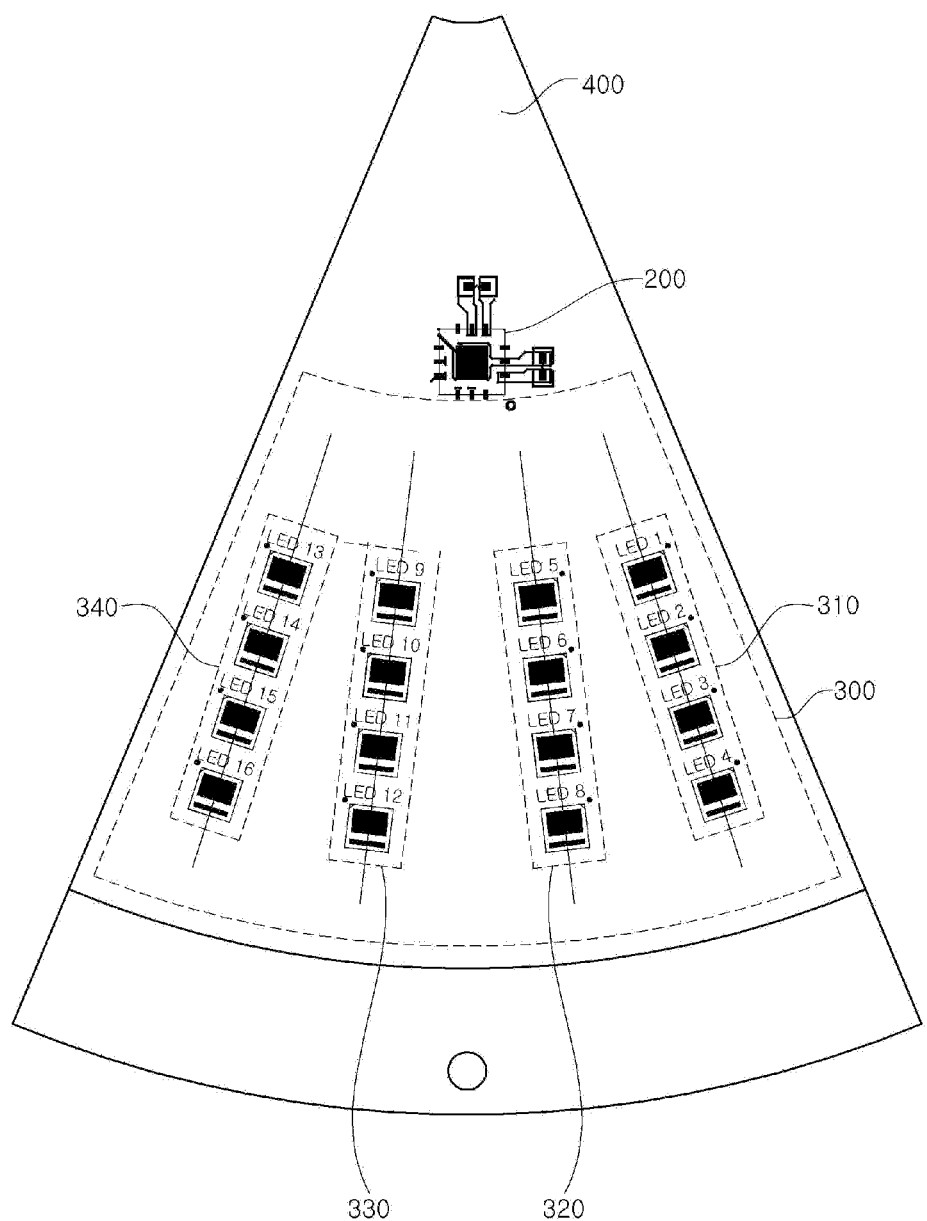
FIG. 14 is a detailed layout diagram of light emitting groups in light emitting blocks according to yet another embodiment of the present invention.

FIG. 14 is a detailed layout diagram of light emitting groups in light emitting blocks according to a ninth exemplary embodiment of the invention. The LED arrangement according to the ninth exemplary embodiment shown in FIG. 14 is a modification of the LED arrangement according to the first exemplary embodiment shown in FIG. 6. Namely, as in the LED arrangement according to the first exemplary embodiment of FIG. 6, in the LED arrangement according to the ninth exemplary embodiment shown in FIG. 14, LEDs are disposed in the light emitting block 350 such that four LEDs placed at the rightmost side in the light emitting block 250 are grouped into a first light emitting group 310; four LEDs placed at the left side of the first light emitting group 310 are grouped into a second light emitting group 320; four LEDs placed at the left side of the second light emitting group 320 are grouped into a third light emitting group 330; and four LEDs placed at the left side of the third light emitting group 330 are grouped into a fourth light emitting group 340. In the first exemplary embodiment is of FIG. 6, only fourteen LEDs are included in the light emitting block 350 and the fourth light emitting group 340 is composed of the thirteenth LED (LED 13) and the fourteenth LED (LED 14) to achieve efficient improvement in luminous flux of the LED lighting apparatus 1000, as described above. In the ninth exemplary embodiment of FIG. 14, sixteen LEDs are included in the light emitting block 350, and the fourth light emitting group 340 is composed of thirteenth to sixteenth LEDs (LED 13 to LED 16). Thus, in the ninth exemplary embodiment of FIG. 14, LEDs are disposed such that the first to fourth light emitting groups 310 to 340 are sequentially turned on in the clockwise direction as the voltage level of the rectified voltage Vrec increases, and the fourth light emitting group 340 to the first light emitting group 310 are sequentially turned off in the counterclockwise direction as the voltage level of the rectified voltage Vrec decreases.

The LED arrangement according to the ninth exemplary embodiment of FIG. 14 is provided for the purpose of illustrating that a single light emitting block 350 may be composed of sixteen LEDs in a similar way to the first to sixth exemplary embodiments and the ninth exemplary embodiment, wherein a single light emitting block 350 is composed of fourteen LEDs. Accordingly, as described above, it should be understood that the number of LEDs included in each of the light emitting groups may be changed in various ways, and such modifications and variations are within the scope of the invention so long as such modifications and variations include the subject matter of the invention.

Although the present invention has been illustrated with reference to some embodiments in conjunction of the accompanying drawings, it should be understood that the embodiments are provided for illustration only and are not intended to limit the scope of the invention, and that various modifications and variations can be made by a person having is ordinary knowledge in the art without departing from the spirit and scope of the invention.

Therefore, the scope of the present invention should be limited only by the attached claims and equivalents thereof.

What is claimed is:

1. An alternating current (AC) light emitting diode (LED) lighting apparatus comprising:
   a circuit board having a circuit pattern formed thereon to electrically connect LEDs to each other; and
   first to n-th light emitting blocks, n being a positive integer ≥2, disposed on the circuit board and driven by AC voltage, each of the light emitting blocks comprising:
   first to m-th light emitting groups, m being a positive integer ≥2, sequentially driven according to a voltage level of the AC voltage, and
   LED drive integrated circuits (ICs) disposed on the circuit board and controlling sequential driving of the first to m-th light emitting groups according to the voltage level of the AC voltage,
   wherein:
   the first to n-th light emitting blocks are radially disposed on a concentric circle about a center of the circuit board, and first to n-th LED drive ICs respectively included in the first to n-th light emitting blocks are disposed adjacent to the center of the circuit board; and
   the first to m-th light emitting groups are arranged in each of the light emitting blocks to be sequentially turned on in a direction from the center of the circuit board toward a periphery thereof as the voltage level of the rectified voltage increases, and to be sequentially turned off in a direction from the periphery of the circuit board toward the center thereof as the voltage level of the rectified voltage decreases, or the first to m-th light emitting groups are arranged in each of the light emitting blocks to be sequentially turned on in a direction from a periphery of the circuit board toward the center thereof as the voltage level of the rectified voltage increases, and to be sequentially turned off in a direction from the center of the circuit board toward the periphery thereof as the voltage level of the rectified voltage decreases.

2. The AC LED lighting apparatus according to claim 1, further comprising:
a power supply unit disposed around the center of the circuit board and supplying AC voltage applied from an external AC power source to the first to n-th LED drive ICs.

3. An alternating current (AC) light emitting diode (LED) lighting apparatus comprising:
a circuit board having a circuit pattern formed thereon to electrically connect LEDs to each other; and
first to n-th light emitting blocks (n being a positive integer ≥2) disposed on the circuit board and driven by AC voltage, each of the light emitting blocks comprising:
first to m-th light emitting groups (m being a positive integer ≥2) sequentially driven according to a voltage level of the AC voltage, and
LED drive integrated circuits (ICs) disposed on the circuit board and controlling sequential driving of the first to m-th light emitting groups according to the voltage level of the AC voltage,
wherein:
the first to n-th light emitting blocks are radially disposed on a concentric circle about a center of the circuit board, and first to n-th LED drive ICs respectively included in the first to n-th light emitting blocks are disposed adjacent to the center of the circuit board; and
the first to m-th light emitting groups are arranged in each of the light emitting blocks to be sequentially turned on in the clockwise direction as the voltage level of the rectified voltage increases, and to be sequentially turned off in the counterclockwise direction as the voltage level of the rectified voltage decreases, or the first to m-th light emitting groups are arranged in each of the light emitting blocks to be sequentially turned on in the counterclockwise direction as the voltage level of the rectified voltage increases, and to be sequentially turned off in the clockwise direction as the voltage level of the rectified voltage decreases.

4. An alternating current (AC) light emitting diode (LED) lighting apparatus comprising:
a circuit board having a circuit pattern formed thereon to electrically connect LEDs to each other; and
first to n-th light emitting blocks (n being a positive integer ≥2) disposed on the circuit board and driven by AC voltage, each of the light emitting blocks comprising:
first to m-th light emitting groups (m being a positive integer ≥2) sequentially driven according to a voltage level of the AC voltage, and
LED drive integrated circuits (ICs) disposed on the circuit board and controlling sequential driving of the first to m-th light emitting groups according to the voltage level of the AC voltage,
wherein:
the first to n-th light emitting blocks are radially disposed on a concentric circle about a center of the circuit board, and first to n-th LED drive ICs respectively included in the first to n-th light emitting blocks are disposed adjacent to the center of the circuit board; and
the first to m-th light emitting groups are arranged in each of the light emitting blocks to be sequentially turned on in a zigzag manner in a direction from the center of the circuit board toward a periphery thereof as the voltage level of the rectified voltage increases, and to be sequentially turned off in a zigzag manner in a direction from the periphery of the circuit board toward the center thereof as the voltage level of the rectified voltage decreases, or the first to m-th light emitting groups are arranged in each of the light emitting blocks to be sequentially turned on in a zigzag manner in a direction from a periphery of the circuit board toward the center thereof as the voltage level of the rectified voltage increases, and to be sequentially turned off in a zigzag manner in a direction from the center of the circuit board toward the periphery thereof as the voltage level of the rectified voltage decreases.

5. An alternating current (AC) light emitting diode (LED) lighting apparatus comprising:
a circuit board having a circuit pattern formed thereon to electrically connect LEDs to each other; and
first to n-th light emitting blocks (n being a positive integer ≥2) disposed on the circuit board and driven by AC voltage, each of the light emitting blocks comprising:
first to m-th light emitting groups (m being a positive integer ≥2) sequentially driven according to a voltage level of the AC voltage, and
LED drive integrated circuits (ICs) disposed on the circuit board and controlling sequential driving of the first to m-th light emitting groups according to the voltage level of the AC voltage,
wherein:
the first to n-th light emitting blocks are radially disposed on a concentric circle about a center of the circuit board, and first to n-th LED drive ICs respectively included in the first to n-th light emitting blocks are disposed adjacent to the center of the circuit board; and
the first to m-th light emitting groups are arranged in each of the light emitting blocks to be sequentially turned on in a zigzag manner in the clockwise direction as the voltage level of the rectified voltage increases, and to be sequentially turned off in a zigzag manner in the counterclockwise direction as the voltage level of the rectified voltage decreases, or the first to m-th light emitting groups are arranged in each of the light emitting blocks to be sequentially turned on in a zigzag manner in the counterclockwise direction as the voltage level of the rectified voltage increases, and to be sequentially turned off in a zigzag manner in the clockwise direction as the voltage level of the rectified voltage decreases.

6. The AC LED lighting apparatus according to claim 1, wherein each of the first to m-th light emitting groups comprises a first string including i LEDs connected in series, i being a positive integer ≥1, and
the first light emitting group, wherein m is 2 or more, or at least one light emitting group selected from among the first to m−1-th light emitting groups, wherein m is 3 or more, further comprises a second string connected in parallel to the first string and including i LEDs connected in series.

7. The AC LED lighting apparatus according to claim 1, wherein the first to m-th light emitting groups and the LED drive ICs are disposed on the same plane of the circuit board.

* * * * *